(12) United States Patent
Seo

(10) Patent No.: US 12,400,985 B2
(45) Date of Patent: Aug. 26, 2025

(54) SEMICONDUCTOR PACKAGE AND METHOD OF FABRICATING THE SAME

(71) Applicant: Samsung Electronics Co., Ltd., Suwon-si (KR)

(72) Inventor: Wonil Seo, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 464 days.

(21) Appl. No.: 17/970,111

(22) Filed: Oct. 20, 2022

(65) Prior Publication Data

US 2023/0317657 A1  Oct. 5, 2023

(30) Foreign Application Priority Data

Apr. 5, 2022 (KR) .................. 10-2022-0042479

(51) Int. Cl.
*H01L 23/00* (2006.01)
*H01L 25/065* (2023.01)

(52) U.S. Cl.
CPC .............. *H01L 24/09* (2013.01); *H01L 24/08* (2013.01); *H01L 24/32* (2013.01); *H01L 24/48* (2013.01);
(Continued)

(58) Field of Classification Search
CPC ......... H01L 24/09; H01L 24/08; H01L 24/32; H01L 24/48
See application file for complete search history.

(56) References Cited

U.S. PATENT DOCUMENTS 6,949,837 B2 * 9/2005 Lee .................. H01L 24/48
257/E23.079
7,021,520 B2 * 4/2006 Bowen ................ H01L 24/85
257/E21.705
(Continued)

FOREIGN PATENT DOCUMENTS

CN  101236959 A  *  8/2008
CN  108022915 A  *  5/2018  ......... H01L 23/3107
(Continued)

OTHER PUBLICATIONS

Li, Hunhui et al., 'Investigation of the characteristics of overhang bonding for 3-D stacked dies in microelectronics packaging' *Microelectronics Reliability*, vol. 51, 2011, pp. 2236-2242.
(Continued)

*Primary Examiner* — Laura M Menz
(74) *Attorney, Agent, or Firm* — Harness, Dickey & Pierce, P.L.C.

(57) ABSTRACT

Disclosed are semiconductor packages and their fabrication methods. The semiconductor package comprises semiconductor chips stacked on a substrate and including first and second pads on top surfaces thereof, and bonding wires connecting the first and second pads to the substrate. The semiconductor chips alternately protrude in a first direction and its opposite direction. The semiconductor chip has a first lateral surface spaced apart from another semiconductor chip. The top surface of the semiconductor chip is provided thereon with a first arrangement line extending along the first lateral surface and with second arrangement lines extending from opposite ends of the first arrangement line.
(Continued)

Wherein as a distance between the first and second arrangement lines increases, a distance between the second arrangement lines and the first lateral surface increases. The first pads are arranged along the first arrangement line. The second pads are arranged along the second arrangement lines.

10 Claims, 19 Drawing Sheets

(52) U.S. Cl.
CPC .............. *H01L 24/73* (2013.01); *H01L 24/85* (2013.01); *H01L 25/0657* (2013.01); *H01L 2224/0801* (2013.01); *H01L 2224/08054* (2013.01); *H01L 2224/08055* (2013.01); *H01L 2224/0903* (2013.01); *H01L 2224/09051* (2013.01); *H01L 2224/09152* (2013.01); *H01L 2224/09153* (2013.01); *H01L 2224/09179* (2013.01); *H01L 2224/0951* (2013.01); *H01L 2224/32145* (2013.01); *H01L 2224/48091* (2013.01); *H01L 2224/48229* (2013.01); *H01L 2224/73265* (2013.01); *H01L 2224/85091* (2013.01); *H01L 2225/0651* (2013.01); *H01L 2225/06524* (2013.01); *H01L 2225/06527* (2013.01); *H01L 2225/06562* (2013.01); *H01L 2225/06565* (2013.01); *H01L 2924/1011* (2013.01); *H01L 2924/10156* (2013.01); *H01L 2924/1436* (2013.01)

(56) References Cited

U.S. PATENT DOCUMENTS

| | | | |
|---|---|---|---|
| 7,683,491 | B2 | 3/2010 | Itoh et al. |
| 8,232,631 | B2* | 7/2012 | Cho .................... H01L 25/0657 257/E23.173 |
| 8,304,918 | B2* | 11/2012 | Tsukano ............. H01L 23/3135 438/109 |
| 8,390,114 | B2* | 3/2013 | Kim ....................... H01L 24/16 257/725 |
| 8,415,808 | B2* | 4/2013 | Liao .................... H01L 25/0657 257/777 |
| 8,536,690 | B2* | 9/2013 | Camacho ............ H01L 23/4334 257/676 |
| 8,552,546 | B2* | 10/2013 | Song ................... H01L 25/0657 257/777 |
| 8,659,137 | B2* | 2/2014 | Omizo ................ H01L 21/6835 257/723 |
| 8,659,175 | B2* | 2/2014 | Ju ....................... H01L 25/0657 257/784 |
| 9,093,441 | B2* | 7/2015 | Kim .................. H01L 23/49827 |
| 9,117,741 | B2* | 8/2015 | Fujii ................... H01L 25/0657 |
| 9,129,846 | B2* | 9/2015 | Song ....................... H01L 25/50 |
| 9,177,863 | B2* | 11/2015 | Gillingham ............ H01L 25/50 |
| 9,293,443 | B2* | 3/2016 | Nam ...................... H01L 24/32 |
| 9,331,055 | B2 | 5/2016 | Kim |
| 9,646,942 | B2* | 5/2017 | Lin ......................... H01L 24/83 |
| 9,691,691 | B2* | 6/2017 | Kim ....................... H01L 24/73 |
| 10,141,293 | B2* | 11/2018 | Kwon ..................... H01L 24/73 |
| 10,147,706 | B2* | 12/2018 | Han ........................ H01L 24/83 |
| 10,510,715 | B2* | 12/2019 | Yu ....................... H01L 25/0657 |
| 11,177,238 | B2* | 11/2021 | Yu ....................... H01L 25/0652 |
| 11,842,983 | B2* | 12/2023 | Yu ......................... H01L 25/50 |
| 11,848,308 | B2* | 12/2023 | Park ................... H01L 25/0657 |
| 2005/0067694 | A1* | 3/2005 | Pon ................... H01L 25/0657 257/723 |
| 2005/0236705 | A1* | 10/2005 | Lim ....................... H01L 24/78 257/E25.013 |
| 2007/0241453 | A1* | 10/2007 | Ha ......................... H01L 25/03 257/723 |
| 2008/0099892 | A1* | 5/2008 | Chen ................. H01L 23/49575 257/670 |
| 2009/0045496 | A1* | 2/2009 | Tian ....................... H01L 23/16 257/E21.598 |
| 2009/0057916 | A1* | 3/2009 | Yeom .................. H01L 25/0657 257/E23.024 |
| 2009/0273099 | A1* | 11/2009 | Matsunaga ............. H01L 24/06 257/786 |
| 2011/0068449 | A1* | 3/2011 | Kook ..................... H01L 25/50 257/784 |
| 2012/0007236 | A1* | 1/2012 | Bae ...................... H01L 23/498 257/737 |
| 2012/0267772 | A1* | 10/2012 | Fujisawa ................ H01L 23/02 257/676 |
| 2013/0127070 | A1* | 5/2013 | Jung ....................... H01L 23/13 257/777 |
| 2013/0147062 | A1* | 6/2013 | Lee ........................ H01L 24/49 438/109 |
| 2014/0175638 | A1* | 6/2014 | Kim .................... H01L 25/0756 257/737 |
| 2014/0175673 | A1* | 6/2014 | Kim ....................... H01L 24/06 257/777 |
| 2015/0102506 | A1* | 4/2015 | Song ....................... H01L 24/05 257/777 |
| 2015/0115468 | A1* | 4/2015 | Chun .................. H01L 25/0657 361/783 |
| 2015/0194410 | A1* | 7/2015 | Nam ...................... H01L 24/32 257/701 |
| 2015/0255381 | A1* | 9/2015 | Kim ....................... H01L 24/73 257/676 |
| 2016/0013158 | A1* | 1/2016 | Kang ...................... H01L 23/13 257/777 |
| 2016/0056122 | A1 | 2/2016 | Jun |
| 2017/0170145 | A1* | 6/2017 | Yu ...................... H01L 25/0652 |
| 2018/0114776 | A1* | 4/2018 | Han .................... H01L 25/0652 |
| 2018/0122790 | A1* | 5/2018 | Kwon ..................... H01L 24/17 |
| 2020/0111763 | A1* | 4/2020 | Hong ...................... H01L 24/08 |
| 2020/0118974 | A1* | 4/2020 | Yu ........................... H01L 25/50 |
| 2020/0286856 | A1* | 9/2020 | Lee ...................... H01L 23/5386 |
| 2021/0183816 | A1* | 6/2021 | Jun ..................... H01L 25/0657 |
| 2022/0068880 | A1* | 3/2022 | Yu ........................... H01L 25/50 |
| 2022/0130802 | A1* | 4/2022 | Jun ........................ H01L 24/14 |
| 2022/0328453 | A1* | 10/2022 | Baik ...................... H01L 24/48 |
| 2022/0406746 | A1* | 12/2022 | Jeon ...................... H01L 24/48 |
| 2023/0028252 | A1* | 1/2023 | Jung ...................... H01L 24/49 |
| 2023/0098993 | A1* | 3/2023 | Oh ......................... H01L 24/48 257/686 |
| 2023/0117654 | A1* | 4/2023 | Kim ....................... H01L 23/16 257/723 |
| 2023/0197687 | A1* | 6/2023 | Bang .................... H01L 25/105 257/777 |
| 2023/0207532 | A1* | 6/2023 | Jun ..................... H01L 25/0657 257/700 |
| 2023/0215829 | A1* | 7/2023 | Hong ..................... H01L 24/32 257/678 |
| 2023/0317657 | A1* | 10/2023 | Seo ..................... H01L 25/0657 |
| 2023/0395568 | A1* | 12/2023 | Kim ....................... H01L 24/48 |
| 2024/0014144 | A1* | 1/2024 | Kim ...................... H01L 23/544 |
| 2024/0021580 | A1* | 1/2024 | Ju ..................... H01L 23/49816 |
| 2024/0038725 | A1* | 2/2024 | Ma ......................... H01L 24/13 |
| 2024/0047296 | A1* | 2/2024 | Ko ......................... H01L 24/16 |
| 2024/0071996 | A1* | 2/2024 | Seo ........................ H01L 24/45 |
| 2024/0170456 | A1* | 5/2024 | Kyung .................... H01L 24/92 |
| 2024/0203942 | A1* | 6/2024 | Jang ....................... H01L 24/16 |
| 2024/0258278 | A1* | 8/2024 | Shin ....................... H01L 24/08 |
| 2024/0274580 | A1* | 8/2024 | Che ................... H01L 25/0657 |
| 2025/0015052 | A1* | 1/2025 | Lee ........................ H01L 24/49 |
| 2025/0054889 | A1* | 2/2025 | Hong ..................... H01L 24/48 |

FOREIGN PATENT DOCUMENTS

| | | | | |
|---|---|---|---|---|
| CN | 110797321 | A | * 2/2020 | ............ H01L 23/16 |
| CN | 108022915 | B | * 1/2021 | ......... H01L 23/3107 |
| CN | 116403987 | A | * 7/2023 | ....... H01L 23/49816 |
| CN | 116936526 | A | * 10/2023 | ............. H01L 24/08 |
| CN | 118507432 | A | * 8/2024 | ......... H01L 21/4803 |
| JP | 2004071997 | A | * 3/2004 | |

(56) References Cited

FOREIGN PATENT DOCUMENTS

| JP | 2006216692 A | * | 8/2006 | ......... H01L 21/6836 |
| JP | 2020145407 A | * | 9/2020 | ............ H01L 23/13 |
| KR | 2011-0124065 A | | 11/2011 | |
| KR | 102242760 B1 | | 4/2021 | |
| TW | 200820402 A | * | 5/2008 | ......... H01L 23/3121 |
| WO | WO-2011142581 A2 | * | 11/2011 | ............ H01L 23/13 |

OTHER PUBLICATIONS

Ivy Qin et al. 'Advances in Wire Bonding Technology for 3D Die Stacking and Fan Out Wafer Level Package' 2017 IEEE 67th Electronic Components and Technology Conference.

* cited by examiner

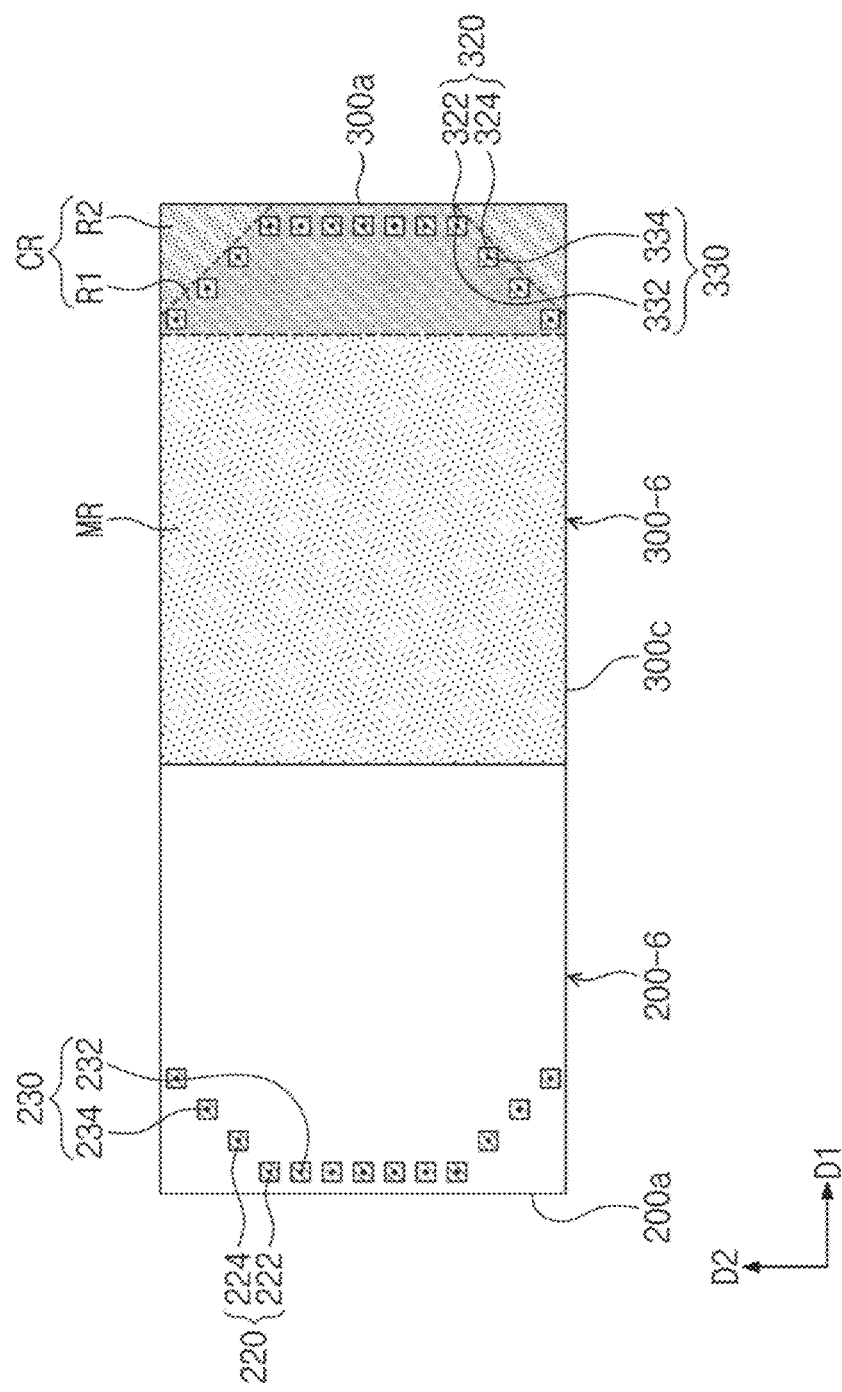

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0042479 filed on Apr. 5, 2022 in the Korean Intellectual Property Office, the disclosure of which is hereby incorporated by reference in its entirety.

BACKGROUND

The present example inventive concepts relate to a semiconductor package and a method of fabricating the same, and more particularly, to a semiconductor package including semiconductor chips and a method of fabricating the same.

A typical stack package has a structure in which a plurality of devices are stacked. For example, the stack package may include semiconductor chips that are sequentially stacked on a printed circuit board (PCB). Connection pads are formed on the semiconductor chips. The connection pads may be connected through a bonding wire to allow the semiconductor chips to electrically connect to the printed circuit board. The printed circuit board is provided thereon with a logic chip that controls the semiconductor chips.

Portable devices have been increasingly demanded in recent electronic product markets, and as a result, it has been ceaselessly required for reduction in size and weight of electronic parts mounted on the portable devices. In order to accomplish the reduction in size and weight of the electronic parts, there is need for technology to integrate a number of individual devices into a single package as well as technology to reduce individual sizes of mounting parts. In particular, with the integration of a plurality of devices, a semiconductor package requires not only excellent structural properties but also superior electrical properties.

SUMMARY

Some embodiments of the present example inventive concepts provide a semiconductor package with increased structural stability and a method of fabricating the same.

Some embodiments of the present example inventive concepts provide a compact-sized semiconductor package and a method of fabricating the same.

Some embodiments of the present example inventive concepts provide a semiconductor fabrication method with less occurrence of failure and a semiconductor package fabricated by the same.

According to some example embodiments of the present inventive concepts, a semiconductor package may comprise: a substrate; a plurality of semiconductor chips stacked on the substrate and each of the plurality of semiconductor chips including a plurality of first pads and a plurality of second pads on top surfaces of the plurality of semiconductor chips; and a plurality of bonding wires that connect the plurality of first pads and the plurality of second pads to the substrate. The plurality of semiconductor chips may protrude alternately in a first direction and a direction opposite to the first direction. Protruding distances of the plurality of semiconductor chips may be the same as each other. The plurality of semiconductor chips may have a first lateral surface spaced apart from another semiconductor chip in overlying or underlying contact with the semiconductor chip. The top surface of each of the plurality of semiconductor chips may be provided thereon with a first arrangement line that extends along the first lateral surface and with a plurality of second arrangement lines that extend from opposite ends of the first arrangement line. Wherein as a distance between the second arrangement lines and the first arrangement line increases, a distance between the second arrangement lines and the first lateral surface increases. The plurality of first pads may be arranged along the first arrangement line. The plurality of second pads may be arranged along the second arrangement lines.

According to some example embodiments of the present inventive concepts, a semiconductor package may comprise: a substrate; a plurality of first semiconductor chips and a plurality of second semiconductor chips that are alternately stacked on the substrate, the plurality of second semiconductor chips being shifted in a first direction from the plurality of first semiconductor chips; a plurality of first bonding wires that connect the substrate to the plurality of second semiconductor chips and are bonded to the plurality of second semiconductor chips; and a molding layer on the substrate, the molding layer covering the plurality of first semiconductor chips and the plurality of second semiconductor chips. Each of the plurality of second semiconductor chips may have a first lateral surface positioned in the first direction and a plurality of second lateral surfaces in contact with the first lateral surface. The plurality of first bonding wires may include a plurality of first sub-wires each having a first end portion and a plurality of second sub-wires each having a second end portion. The first end portions may be arranged on a first line that extends along the first lateral surface. The second end portions may be arranged on a plurality of second lines that run across the first lateral surface and one of the second lateral surfaces. On one of the plurality of second semiconductor chips, the first end portions of the first sub-wires may be closer to the first lateral surface than the second end portions of the second sub-wires, and as a distance between the second sub-wires and the second lateral surfaces decreases a distance between the second end portions and the first lateral surface increases. As a distance between the substrate and the plurality of second semiconductor chips increases, a distance between the first lateral surface and the second end portions of the second sub-wires increases.

According to some example embodiments of the present inventive concepts, a method of fabricating a semiconductor package may comprise: placing a first semiconductor chip on a substrate; stacking on the first semiconductor chip a second semiconductor chip that is shifted in a first direction from the first semiconductor chip, the second semiconductor chip including a plurality of chip pads on a top surface of the second semiconductor chip and adjacent to a first lateral surface in the first direction of the second semiconductor chip; and using a bonding machine to bond a plurality of bonding wires to the chip pads. The top surface of the second semiconductor chip may have a plurality of chamfer regions on corners adjacent to the first lateral surface. The chip pads may not be on the chamfer regions.

According to some example embodiments of the present inventive concepts, a semiconductor package may comprise: a substrate; and a plurality of semiconductor chips stacked on the substrate. A top surface of each of the plurality of semiconductor chips may have: a connection region adjacent to a first lateral surface of the plurality of semiconductor chips; and a mounting region adjacent to a second lateral surface of the plurality of semiconductor chips. The second lateral surface may be opposite to the first lateral surface. One of the plurality of semiconductor chips may be attached to the mounting region of another of the plurality of semiconductor chips. The another semiconductor chip may be below the one semiconductor chip. The connection region of the another semiconductor chip may be exposed. The connection region may include: a plurality of chamfer regions adjacent to opposite ends of the first lateral surface; and an intermediate region between the chamfer regions. Each of the plurality of semiconductor chips may include a plurality of first pads and a plurality of second pads on the intermediate region. The first pads may be arranged along the first lateral surface. The second pads may be arranged along boundaries between the intermediate region and the chamfer regions. The first pads may be closer than the second pads to the first lateral surface.

BRIEF DESCRIPTION OF THE DRAWINGS

FIGS. 18 to 20 illustrate plan views showing a semiconductor package according to some example embodiments of the present inventive concepts.

FIGS. 21A to 25A and 23C illustrate cross-sectional views showing a method of fabricating a semiconductor package according to some example embodiments of the present inventive concepts.

FIGS. 21B to 25B illustrate plan views showing a method of fabricating a semiconductor package according to some example embodiments of the present inventive concepts.

DETAILED DESCRIPTION OF EMBODIMENTS

The following will now describe a semiconductor package according to the present example embodiments with reference to the accompanying drawings.

Figure 1:
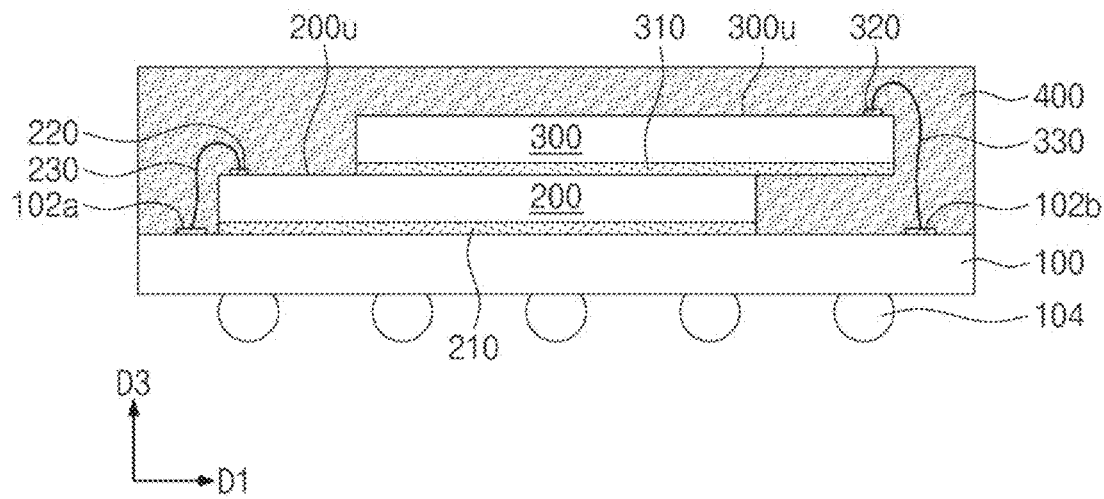
FIG. 1 illustrates a cross-sectional view showing a semiconductor package according to some example embodiments of the present inventive concepts.
Figure 2:
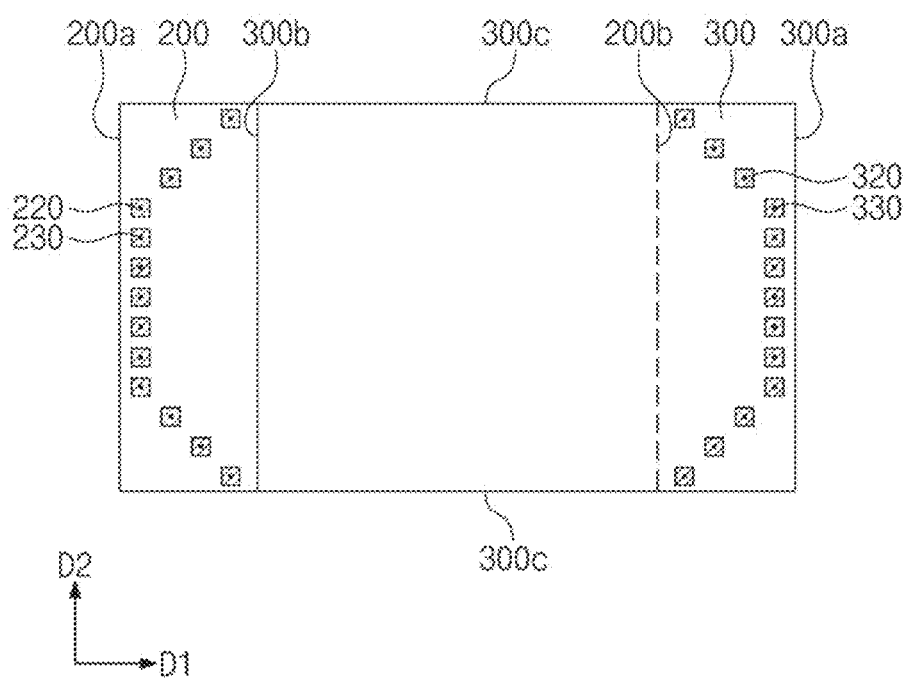
FIGS. 2 to 5 illustrate plan views showing a semiconductor package according to some example embodiments of the present inventive concepts.
Figure 3:
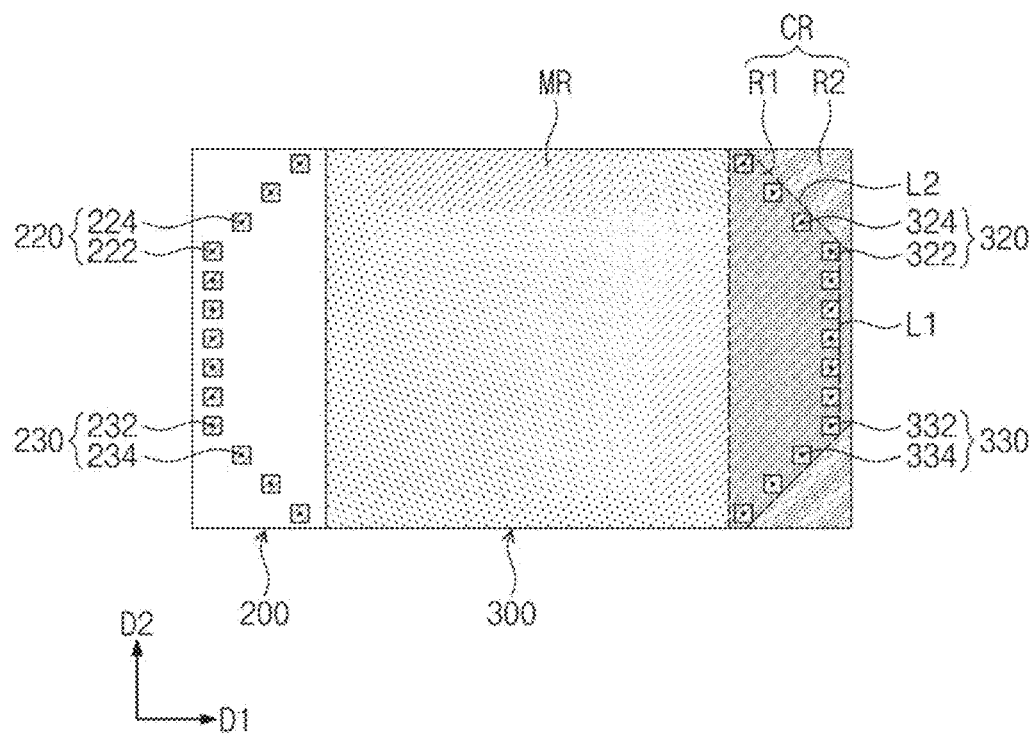

FIG. 1 illustrates a cross-sectional view showing a semiconductor package according to some example embodiments of the present inventive concepts. FIG. 2 illustrates a plan view showing first and second semiconductor chips of a semiconductor package according to some example embodiments of the present inventive concepts. For convenience of description, FIG. 3 illustrates a plan view of regions on a top surface of the second semiconductor chip depicted in FIG. 2, showing a semiconductor package according to some example embodiments of the present inventive concepts.

Referring to FIGS. 1 and 2, a package substrate 100 may be provided. The package substrate 100 may be a printed circuit board (PCB) having a signal pattern provided on a top surface thereof. The signal pattern may include first and second substrate pads 102a and 102b. The package substrate 100 may have a structure in which at least one dielectric pattern and at least one wiring pattern are alternately stacked. The package substrate 100 may be provided with external terminals 104 on a bottom surface thereof. The external terminals 104 may include solder balls, solder bumps, or solder pads. Based on the type of the external terminals 104, the package substrate 100 may have a ball grid array (BGA) type, a fine ball-grid array (FBGA) type, or a land grid array (LGA) type.

In this description, a first direction D1 and a second direction D2 may be defined to indicate directions that are parallel to a top surface of the package substrate 100 and intersect each other, and a third direction D3 may be defined to indicate a direction perpendicular to the top surface of the package substrate 100.

A chip stack may be provided on the package substrate 100. The chip stack may include semiconductor chips 200 and 300 that are stacked in the third direction D3 on the package substrate 100. For convenience of description below, a first semiconductor chip 200 may be defined to denote a semiconductor chip at a lower position of the semiconductor chips 200 and 300 depicted in FIGS. 1 to 4, and a second semiconductor chip 300 may be defined to denote a semiconductor chip that immediately overlies the first semiconductor chip 200. However, different naming of the first semiconductor chip 200 and the second semiconductor chip 300 may not mean that the first semiconductor chip 200 and the second semiconductor chip 300 are different chips from each other. The first and second semiconductor chips 200 and 300 may be semiconductor chips having substantially the same configuration and shape as each other, or alternatively may be semiconductor chips different from each other. The first and second semiconductor chips 200 and 300 may be memory chips. For example, the first and second semiconductor chips 200 and 300 may include a dynamic random access memory (DRAM).

The first semiconductor chip 200 may be disposed on the package substrate 100. The first semiconductor chip 200 may have a first lateral surface 200a and a second lateral surface 200b that are opposite to each other in the first direction DE For example, the first lateral surface 200a may be a side surface positioned in a direction opposite to the first direction D1 of the first semiconductor chip 200, and the second lateral surface 200b may be a side surface positioned in the first direction D1 of the first semiconductor chip 200.

A top surface 200u of the first semiconductor chip 200 may have a mounting region to which is attached the second semiconductor chip 300 which will be discussed below, and may also have a connection region that does not overlaps the second semiconductor chip 300. In this description, on the top surface 200u of the first semiconductor chip 200, the mounting region may be a section where a different semiconductor chip is attached to, and the connection region may be a section where first chip pads 220 are provided for electrical connection of the first semiconductor chip 200. The mounting region and the connection region may be identically applicable to the same components of the second semiconductor chip 300, or to a mounting region MR and a connection region CR of the second semiconductor chip 300. The connection region of the first semiconductor chip 200 may be disposed adjacent to the first lateral surface 200a. The mounting region of the first semiconductor chip 200 may be disposed adjacent to the second lateral surface 200b.

The first semiconductor chip 200 may be attached through a first adhesive layer 210 to the package substrate 100. For example, the first adhesive layer 210 may be provided on a bottom surface of the first semiconductor chip 200, and may adhere the first semiconductor chip 200 to the top surface of the package substrate 100. The first semiconductor chip 200 may be attached in a face-up state to the package substrate 100. The top surface 200u may be an active surface of the first semiconductor chip 200. For example, the first chip pads 220 may be provided on the connection region on the top surface 200u of the first semiconductor chip 200. The first chip pads 220 may be connected to an integrated circuit of the first semiconductor chip 200. An arrangement and configuration of the first chip pads 220 will be further described in detail below together with an arrangement and configuration of second chip pads 320.

The second semiconductor chip 300 may be disposed on the first semiconductor chip 200. The third semiconductor chip 300 may have a third lateral surface 300a and a fourth lateral surface 300b that are opposite to each other in the first direction D1. For example, the third lateral surface 300a may be a side surface positioned in the first direction D1 of the second semiconductor chip 300, and the fourth lateral surface 300b may be a side surface positioned in a direction opposite to the first direction D1 of the second semiconductor chip 300.

Referring together to FIGS. 1 to 3, a top surface of the second semiconductor chip 300 may have a mounting region MR and a connection region CR. The connection region CR of the second semiconductor chip 300 may be disposed adjacent to the third lateral surface 300a. The mounting region MR of the second semiconductor chip 300 may be disposed adjacent to the fourth lateral surface 300b. On the top surface 300u of the second semiconductor chip 300, the connection region CR may indicate a section where second chip pads 320 are provided for electrical connection of the second semiconductor chip 300. On the top surface 300u of the second semiconductor chip 300, the mounting region MR may be a section where the second chip pads 320 are not provided, or alternatively, different semiconductor chips may be attached on the mounting region MR of the second semiconductor chip 300.

The second semiconductor chip 300 may be attached through a second adhesive layer 310 to the first semiconductor chip 200. For example, the second adhesive layer 310 may be provided on a bottom surface of the second semiconductor chip 300, and may adhere the second semiconductor chip 300 to the mounting region on the top surface 200u of the first semiconductor chip 200. The second semiconductor chip 300 may be attached in a face-up state to the first semiconductor chip 200. The top surface 300u may be an active surface of the second semiconductor chip 300. For example, second chip pads 320 may be provided on the connection region CR on the top surface 300u of the second semiconductor chip 300. The second chip pads 320 may be connected to an integrated circuit of the second semiconductor chip 300.

The second semiconductor chip 300 may have the second chip pads 320 provided on the connection region CR. The second chip pads 320 may be disposed adjacent to the third lateral surface 300a of the second semiconductor chip 300. In this case, the second chip pads 320 may be provided spaced apart from corners of the second semiconductor chip 300.

For example, the connection region CR may be disposed adjacent to the third lateral surface 300a of the second semiconductor chip 300. The connection region CR may have second regions R2 each of which is adjacent to one of the corners of the second semiconductor chip 300, and may also have a first region R1 adjacent to the third lateral surface 300a between the second regions R2. Each of the second regions R2 may be disposed on one of the corners. For example, when viewed in a plan view, the second regions R2 may be chamfer regions defined by the third lateral surface 300a, fifth lateral surfaces 300c, and second lines L2. In this description, the chamfer region may be a section provided on a corner where two sides meet each other. The fifth lateral surface 300c may be side surfaces of the second semiconductor chip 300 that are in contact with the third lateral surface 300a of the second semiconductor chip 300, and the second lines L2 may each be an imaginary line that runs across the third lateral surface 300a and one of the fifth lateral surfaces 300c. The phrase "run(s) across the third lateral surface 300a and one of the fifth lateral surfaces 300c" may mean that, when the second line L2 extends when viewed in a plan view, the second line L2 may intersect both of the third lateral surface 300a and one of the fifth lateral surfaces 300c. The first region R1 may be an intermediate region other than the second regions R2 on the connection region CR. For example, the second regions R2 may each have a triangular shape which is disposed on a corresponding corner of the second semiconductor chip 300 and whose width decreases with increasing distance from the third lateral surface 300a, and the first region R1 may have a shape whose width decreases with increasing distance from the third lateral surface 300a. For example, a portion of the first region R1 may have a trapezoidal shape.

The second chip pads 320 may be provided on the first region R1 on the top surface 300u of the second semiconductor chip 300. For example, the second chip pads 320 may be arranged along a first line L1 and the second lines L2 on the first region RE For example, the first line L1 and the second lines L2 may be imaginary lines, or arrangement lines, that define positions of the second chip pads 320 on the second semiconductor chip 300. The first line L1 may extend along the third lateral surface 300a. The first line L1 may be a straight line parallel to the third lateral surface 300a. The second lines L2 may extend toward the fifth lateral surfaces 300c from opposite ends of the first line L1. The second lines L2 may become far away from the third lateral surface 300a as the second lines L2 are directed toward the fifth lateral surfaces 300c from opposite ends of the first line L1. As discussed in defining the first region R1 and the second regions R2, the second lines L2 may correspond to boundaries between the first region R1 and the second regions R2. The second lines L2 may each be a straight line that is inclined at an angle of about 45 degrees relative to the third lateral surface 300a. As used herein, the term "45 degrees" is intended to be understood to include manufacturing or material tolerances and/or a deviation in magnitude or angle from 45 degrees that is less than or equal to ±10%. The present inventive concepts, however, are not limited thereto, and angles between the second lines L2 and the third lateral surface 300a may be variously changed if necessary.

On the first region R1, the second chip pads 320 may include first unit pads 322 arranged along the first line L1 and second unit pads 324 arranged along the second lines L2. The first unit pads 322 may be disposed closer than the second unit pads 324 to the third lateral surface 300a. The first unit pads 322 may be arranged in the second direction D2 so as to be parallel to the third lateral surface 300a. The closer to the fifth lateral surfaces 300c the second unit pads 324 are disposed, the farther away from the third lateral surface 300a the second unit pads 324 are disposed. The second chip pads 320 may not be provided on the second region R2.

The first and second semiconductor chips 200 and 300 may be disposed in an offset stack structure. For example, the first and second semiconductor chips 200 and 300 may be stacked obliquely in the first direction D1, which may result in an ascending stepwise shape. For more detail, the first semiconductor chip 200 may protrude from the second semiconductor chip 300 in a direction opposite to the first direction D1, and the first lateral surface 200a of the first semiconductor chip 200 may be spaced apart from the second semiconductor chip 300. The second semiconductor chip 300 may protrude in the first direction D1 from the first semiconductor chip 200, and the third lateral surface 300a of the second semiconductor chip 300 may be spaced apart from the first semiconductor chip 200. As the first and second semiconductor chips 200 and 300 are stacked in a stepwise shape, there may be exposed a portion of the top surface 200u of the first semiconductor chip 200, or the mounting region of the first semiconductor chip 200.

The first semiconductor chip 200 may have the first chip pads 220 provided on the connection region. An arrangement and shape of the first chip pads 220 may be the same as or similar to an arrangement and shape of the second chip pads 320. For example, a planar shape of the first semiconductor chip 200 may be symmetric in the first direction D1 to that of the second semiconductor chip 300. The expression "symmetric in the first direction D1" may include the meaning of both line symmetric in the second direction D2 orthogonal to the first direction D1 and point symmetric in the third direction D3 perpendicular to the first direction D1. The first chip pads 220 may be disposed adjacent to the first lateral surface 200a of the first semiconductor chip 200. For example, the first chip pads 220 may have third unit pads 222 and fourth unit pads 224. The third unit pads 222 may be arranged in the second direction D2 so as to be parallel to the first lateral surface 200a. The closer the fourth unit pads 224 are to one lateral surface in contact with the first lateral surface 200a, the farther the fourth unit pads 224 are away from the first lateral surface 200a. The fourth unit pads 224 may be disposed closer than the third unit pads 222 to the one lateral surface. The third unit pads 222 may be disposed closer than the fourth unit pads 224 to the first lateral surface 200a. The first chip pads 220 may not be provided on a chamfer region adjacent to the corners of the first semiconductor chip 200. The chamfer region of the first semiconductor chip 200 may correspond to the second region R2 of the second semiconductor chip 300.

The first and second semiconductor chips 200 and 300 may be wire-bonded to the package substrate 100. The first and second semiconductor chips 200 and 300 may be connected through first and second bonding wires 230 and 330 to the package substrate 100. For example, the first bonding wires 230 may connect the first chip pads 220 of the first semiconductor chip 200 to first substrate pads 102a of the package substrate 100. The first bonding wires 230 may include first end portions coupled to the first chip pads 220, second end portions coupled to the first substrate pads 102a, and wire loops that connect the first end portions to the second end portions. When viewed in a plan view, the first substrate pads 102a may be positioned in a direction opposite to the first direction D1 of the first semiconductor chip 200. The first substrate pads 102a may be disposed adjacent to the first lateral surface 200a of the first semiconductor chip 200. For example, the second bonding wires 330 may connect the second chip pads 320 of the second semiconductor chip 300 to second substrate pads 102b of the package substrate 100. The second bonding wires 330 may include third end portions coupled to the second chip pads 320, fourth end portions coupled to the second substrate pads 102b, and wire loops that connect the third end portions to the fourth end portions. When viewed in a plan view, the second substrate pads 102b may be positioned in the first direction D1 of the second semiconductor chip 300. For example, the second substrate pads 102b may be disposed adjacent to the third lateral surface 300a of the second semiconductor chip 300.

The first bonding wires 230 may include third sub-wires 232 coupled to the third unit pads 222 and fourth sub-wires 234 coupled to the fourth unit pads 224. For example, the first bonding wires 230 may not be connected to the chamfer region of the first semiconductor chip 200. The second bonding wires 330 may include first sub-wires 332 coupled to the first unit pads 322 and second sub-wires 334 coupled to the second unit pads 324. For example, the second bonding wires 330 may not be connected to the second region R2 of the second semiconductor chip 300.

Bonding positions (or end portions of the first sub-wires 332) of the first sub-wires 332 to the first unit pads 322 and bonding positions (or end portions of the second sub-wires 334) of the second sub-wires 334 to the second unit pads 324 may depend on the first unit pads 322 and the second unit pads 324. For example, the bonding positions (or end portions of the first sub-wires 332) of the first sub-wires 332 to the first unit pads 322 may be arranged along the first line L1 on the first region RE The bonding positions (or end portions of the second sub-wires 334) of the second sub-wires 334 to the second unit pads 324 may be arranged along the second line L2 on the first region R1 and may not be positioned on the second region R2.

According to some example embodiments of the present inventive concepts, no pads may be provided adjacent to corners of the semiconductor chips 200 and 300. Therefore, the semiconductor chips 200 and 300 may be applied with small pressure and torque in a wire bonding process of semiconductor package fabrication. Accordingly, a semiconductor package may not be damaged during fabrication thereof and may be provided with structural stability. This will be further discussed in detail below in describing a method of fabricating a semiconductor package.

A molding layer 400 may be provided on the package substrate 100. The molding layer 400 may cover the first semiconductor chip 200 and the second semiconductor chip 300. The molding layer 400 may include a dielectric polymer material, such as an epoxy molding compound (EMC).

Figure 4:
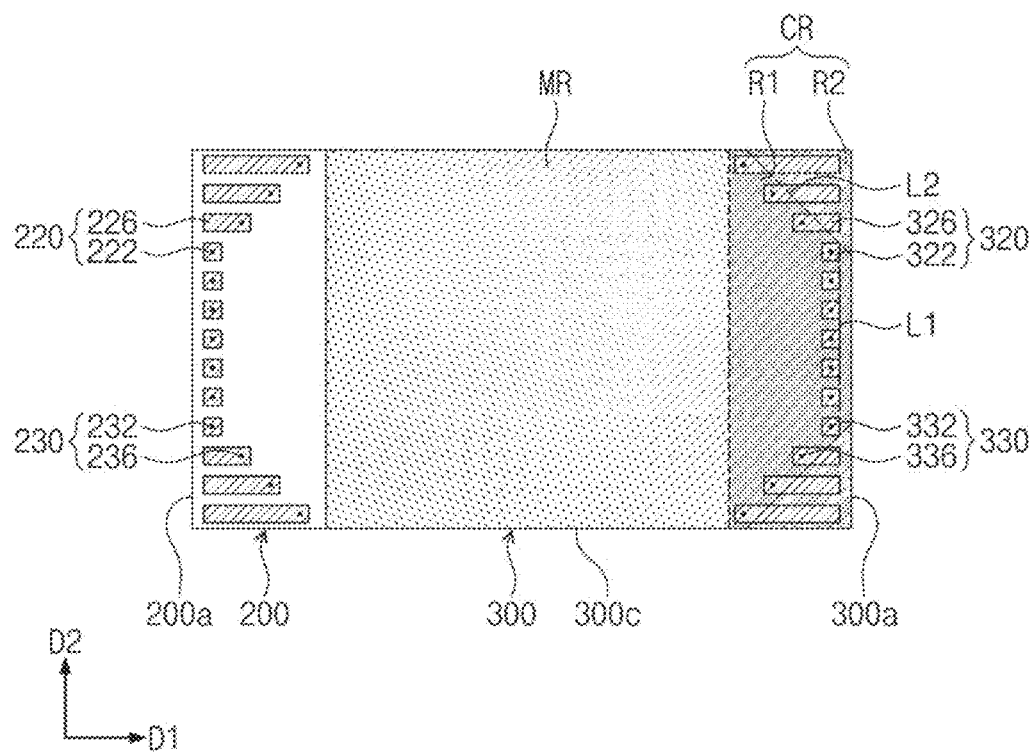

For convenience of description, FIG. 4 illustrates a plan view of regions on a top surface of the second semiconductor chip, showing a semiconductor package according to some example embodiments of the present inventive concepts. For convenience of description, components the same as those of the example embodiments discussed with reference to FIGS. 1 to 3 are allocated the same reference numerals thereto, and a repetitive explanation thereof will be omitted or abridged below. The following description will focus on differences between the example embodiments of FIGS. 1 to 3 and other example embodiments described below.

Referring to FIGS. 1 and 4, the first semiconductor chip 200 and the second semiconductor chip 300 may be provided on the package substrate 100. The second chip pads 320 are adopted as a representative example to describe an arrangement and configuration of the first chip pads 220 of the first semiconductor chip 200 and an arrangement and configuration of the second chip pads 320 of the second semiconductor chip 300.

On the first region R1, the second chip pads 320 may include first unit pads 322 arranged along the first line L1 and fifth unit pads 326 arranged along the second lines L2. The first unit pads 322 may be disposed adjacent to the third lateral surface 300a. The first unit pads 322 may be arranged in the second direction D2 so as to be parallel to the third lateral surface 300a. The fifth unit pads 326 may be arranged along the second lines L2 on the first region R1, and each of the fifth unit pads 326 may extend onto the second region R2. For example, the fifth unit pads 326 of FIG. 4 may have their shapes obtained when the second unit pads 324 of FIG. 3 extend toward the third lateral surface 300a. The fifth unit pads 326 may have their linear shapes that extend toward the third lateral surface 300a from the first region R1 onto the second regions R2. When viewed in a plan view, the fifth unit pads 326 and the first unit pads 322 may have their lateral surfaces directed toward the third lateral surface 300a, and the lateral surfaces of the fifth unit pads 326 may be positioned on the same line on which the lateral surfaces of the first unit pads 322 are positioned. For example, a distance from the third lateral surface 300a to the fifth unit pads 326 may be substantially the same as that from the third lateral surface 300a to the first unit pads 322.

The second semiconductor chip 300 may be wire-bonded to the package substrate 100. The second semiconductor chip 300 may be connected through the second bonding wires 330 to the package substrate 100.

The second bonding wires 330 may include first sub-wires 332 coupled to the first unit pads 322 and fifth sub-wires 336 coupled to the fifth unit pads 326. Bonding positions (or end portions of the fifth sub-wires 336) of the fifth sub-wires 336 to the fifth unit pads 326 may be positioned on the first region RE The closer to the fifth lateral surfaces 300c are disposed the bonding positions of the fifth sub-wires 336 to the fifth unit pads 326, the farther away from the third lateral surface 300a are disposed the bonding positions of the fifth sub-wires 336 to the fifth unit pads 326. For example, the second bonding wires 330 may not be bonded to the second region R2 of the second semiconductor chip 300. FIG. 4 shows that all of the fifth sub-wires 336 are coupled to the fifth unit pads 326 on the second region R2, but if necessary, the second sub-wires 334 may be correspondingly connected to the fifth unit pads 326 on the first region R1.

The first semiconductor chip 200 may have the first chip pads 220 provided on the connection region. An arrangement and shape of the first chip pads 220 may be the same as or similar to an arrangement and shape of the second chip pads 320. The first chip pads 220 may be disposed adjacent to the first lateral surface 200a of the first semiconductor chip 200. For example, the first chip pads 220 may have third unit pads 222 and sixth unit pads 226. The third unit pads 222 may be arranged in the second direction D2 so as to be parallel to the first lateral surface 200a. The sixth unit pads 226 of FIG. 4 may have their shapes obtained when the fourth unit pads 224 of FIG. 3 extend toward the first lateral surface 200a. The sixth unit pads 226 may have their linear shapes that extend toward the first lateral surface 200a. When viewed in a plan view, the sixth unit pads 226 and the third unit pads 222 may have their lateral surfaces directed toward the first lateral surface 200a, and the lateral surfaces of the sixth unit pads 226 may be positioned on the same line on which the lateral surfaces of the third unit pads 222 are positioned.

The first semiconductor chip 200 may be wire-bonded to the package substrate 100. The first semiconductor chip 200 may be connected through the first bonding wires 230 to the package substrate 100.

The first bonding wires 230 may include third sub-wires 232 coupled to the third unit pads 222 and sixth sub-wires 236 coupled to the sixth unit pads 226. The closer the bonding positions of the sixth sub-wires 236 to the sixth unit pads 226 are to opposite lateral surfaces in the second direction D2 of the first semiconductor chip 200, the farther the bonding positions of the sixth sub-wires 236 to the sixth unit pads 226 are away from the first lateral surface 200a. For example, the first bonding wires 230 may not be bonded to the chamfer region of the first semiconductor chip 200. If necessary, the sixth sub-wires 236 may be connected to various positions on the sixth unit pads 226.

Figure 5:
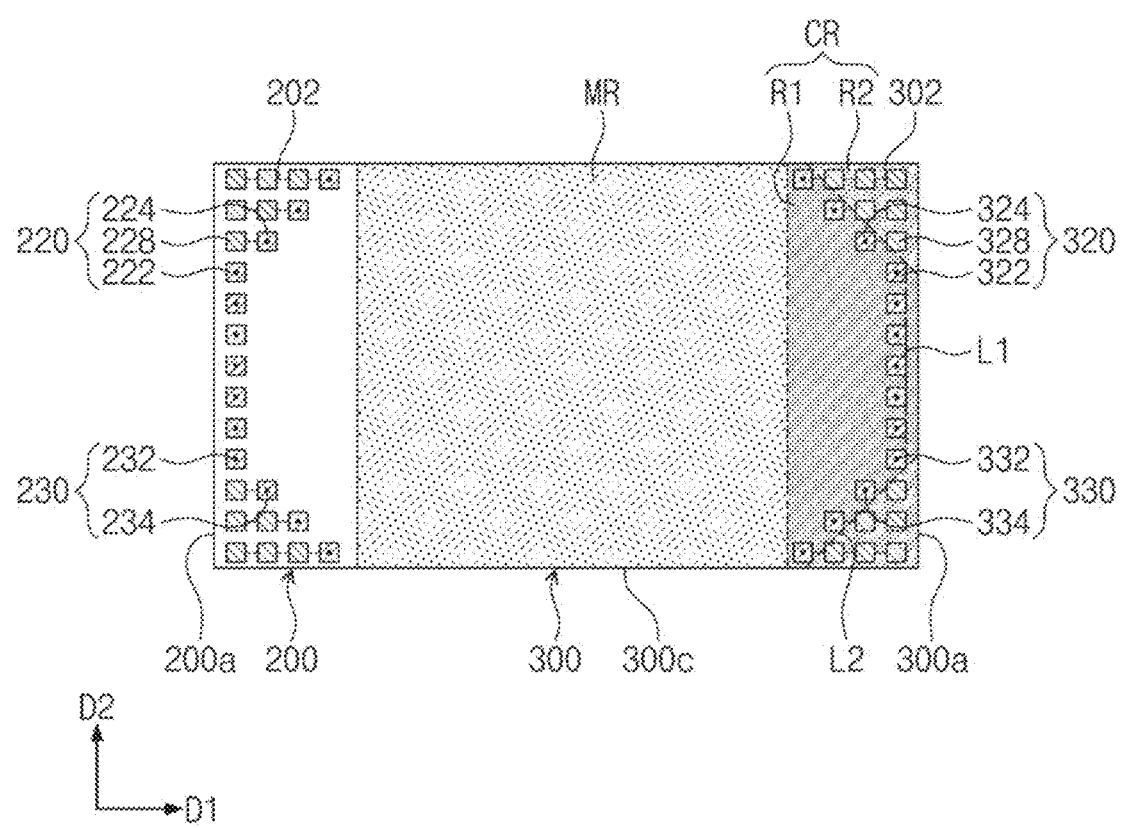

For convenience of description, FIG. 5 illustrates a plan view of regions on a top surface of the second semiconductor chip, showing a semiconductor package according to some example embodiments of the present inventive concepts.

Referring to FIGS. 1 and 5, the first semiconductor chip 200 and the second semiconductor chip 300 may be provided on the package substrate 100. The second chip pads 320 are adopted as a representative example to describe an arrangement and configuration of the first chip pads 220 of the first semiconductor chip 200 and an arrangement and configuration of the second chip pads 320 of the second semiconductor chip 300.

The second chip pads 320 may include first unit pads 322 arranged along the first line L1 on the first region R1, second unit pads 324 arranged along the second lines L2 on the first region R1, and first dummy pads 328 disposed on the second regions R2. The first unit pads 322 may be disposed adjacent to the third lateral surface 300a. The first unit pads 322 may be arranged in the second direction D2 so as to be parallel to the third lateral surface 300a. The closer to the fifth lateral surfaces 300c the second unit pads 324 are disposed, the farther away from the third lateral surface 300a the second unit pads 324 are disposed. The second chip pads 320 may not be provided on the second region R2. One or more first dummy pads 328 may be positioned in the first direction D1 of one of the second unit pads 324. At least one first dummy pad 328 may be disposed in the first direction D1 of each of the second unit pads 324. In this case, an increase in distance between the third lateral surface 300a and the second unit pads 324 may induce an increase in the number of the first dummy pads 328 positioned in the first direction D1 of the second unit pad 324. The second unit pads 324 and the first dummy pads 328 may be arranged along the first direction D1 and the second direction D2. A single pad group may be constituted by one second unit pad 324 and at least one first dummy pad 328 that is disposed in the first direction D1 of the one second unit pad 324. For example, the one second unit pad 324 and the at least one first dummy pad 328 that is arranged in the first direction D1 of the one second unit pad 324 may be electrically connected to each other through an internal line 302 of the second semiconductor chip 300. When viewed in a plan view, a lateral surface of the first dummy pad 328 most adjacent to the third lateral surface 300a in one pad group may be positioned on the same line on which lateral surfaces of the first unit pads 322 directed toward the third lateral surface 300a.

The second semiconductor chip 300 may be wire-bonded to the package substrate 100. The second semiconductor chip 300 may be connected through the second bonding wires 330 to the package substrate 100.

The second bonding wires 330 may include first sub-wires 332 coupled to the first unit pads 322 and second sub-wires 334 coupled to the second unit pads 324. FIG. 5 shows that all of the second sub-wires 334 are coupled to the second unit pads 324, but if necessary, in one pad group, each of the second sub-wires 334 may be connected to one of the first dummy pads 328 and the second unit pad 324 of the one pad group.

The first semiconductor chip 200 may have the first chip pads 220 provided on the connection region. An arrangement and shape of the first chip pads 220 may be the same as or similar to an arrangement and shape of the second chip pads 320. The first chip pads 220 may be disposed adjacent to the first lateral surface 200a of the first semiconductor chip 200. For example, the first chip pads 220 may have third unit pads 222, fourth unit pads 224, and second dummy pads 228. The third unit pads 222 may be arranged in the second direction D2 so as to be parallel to the first lateral surface 200a. The fourth unit pads 224 may be disposed adjacent to corners of the first semiconductor chip 200, and the closer the fourth unit pads 224 are to opposite lateral surfaces in the second direction D2 of the first semiconductor chip 200, the farther the fourth unit pads 224 are away from the first lateral surface 200a. The second dummy pads 228 may be positioned in a direction opposite to the first direction D1 of one of the fourth unit pads 224. At least one second dummy pads 228 may be disposed in a direction opposite to the first direction D1 of each of the fourth unit pads 224. In this case, an increase in distance between the first lateral surface 200a and the fourth unit pads 224 may induce an increase in the number of the second dummy pads 228 positioned in a direction opposite to the first direction D1 of the fourth unit pad 224. A single pad group may be constituted by one fourth unit pad 224 and at least one second dummy pad 228 that is arranged in a direction opposite to the first direction D1 of the one fourth unit pad 224. For example, the one fourth unit pad 224 and the at least one second dummy pad 228 that is arranged in a direction opposite to the first direction D1 of the one fourth unit pad 224 may be electrically connected to each other through an internal line 202 of the first semiconductor chip 200. When viewed in a plan view, a lateral surface of the second dummy pad 228 most adjacent to the first lateral surface 200a in one pad group may be positioned on the same line on which lateral surfaces of the third unit pads 222 directed toward the first lateral surface 200a.

The first semiconductor chip 200 may be wire-bonded to the package substrate 100. The first semiconductor chip 200 may be connected through the first bonding wires 230 to the package substrate 100.

The first bonding wires 230 may include third sub-wires 232 coupled to the third unit pads 222 and fourth sub-wires 234 coupled to the fourth unit pads 224. FIG. 5 shows that all of the fourth sub-wires 234 are coupled to the fourth unit pads 224, but if necessary, in one pad group, each of the fourth sub-wires 234 may be connected to one of the second dummy pads 228 and the fourth unit pad 224 of the one pad group.

Figure 6:
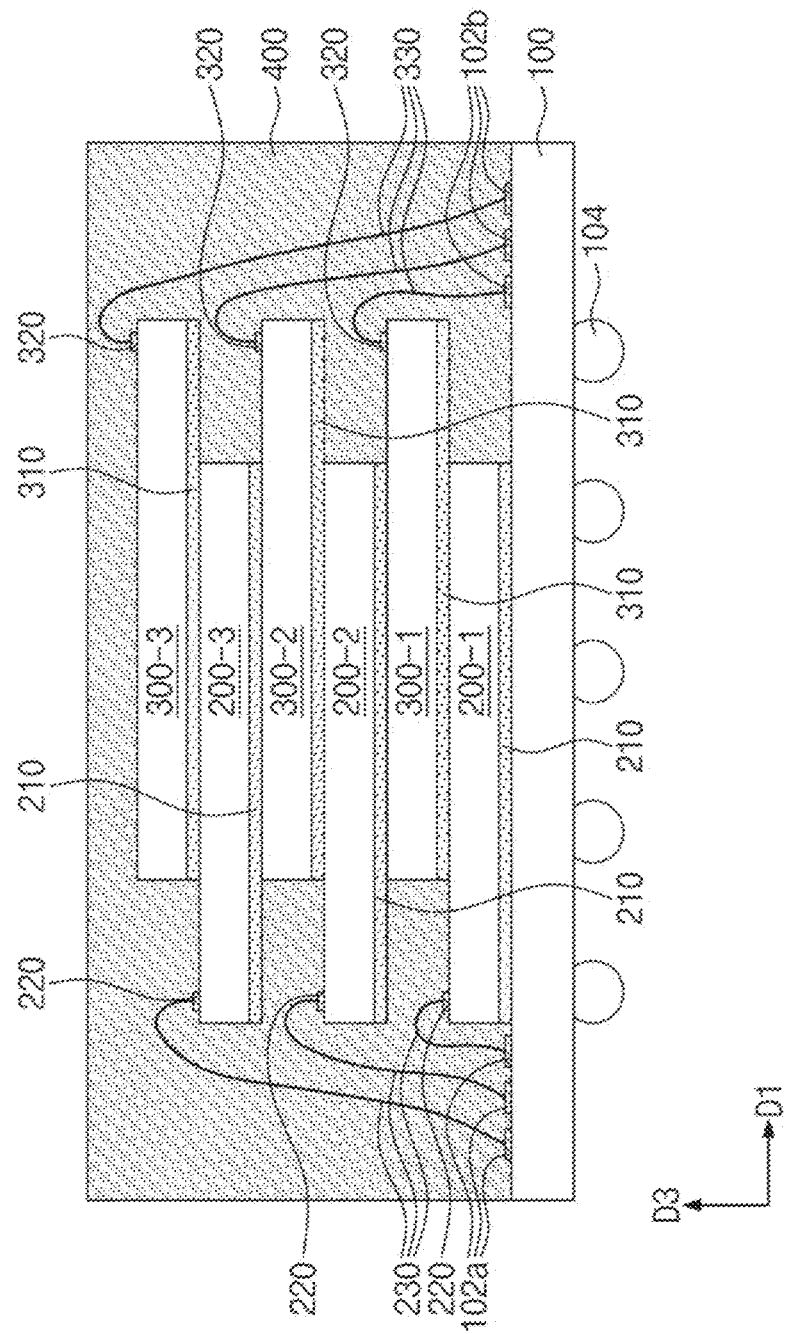
FIG. 6 illustrates a cross-sectional view showing a semiconductor package according to some example embodiments of the present inventive concepts.
Figure 7:
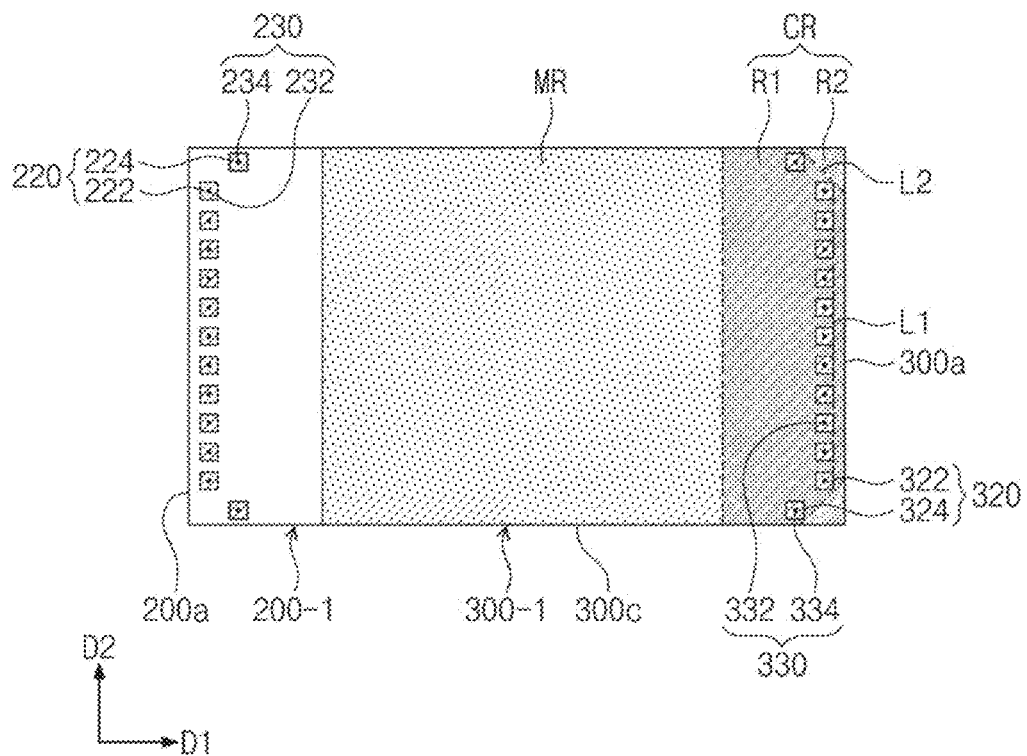
FIGS. 7 to 15 illustrate plan views showing a semiconductor package according to some example embodiments of the present inventive concepts.
Figure 8:
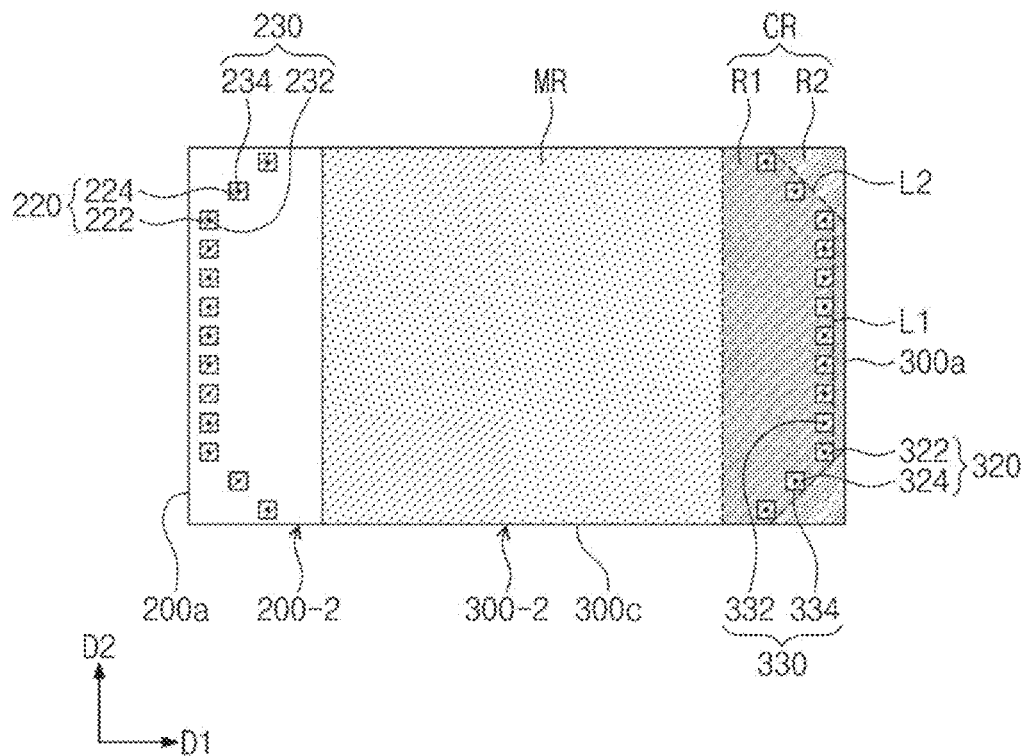
Figure 9:
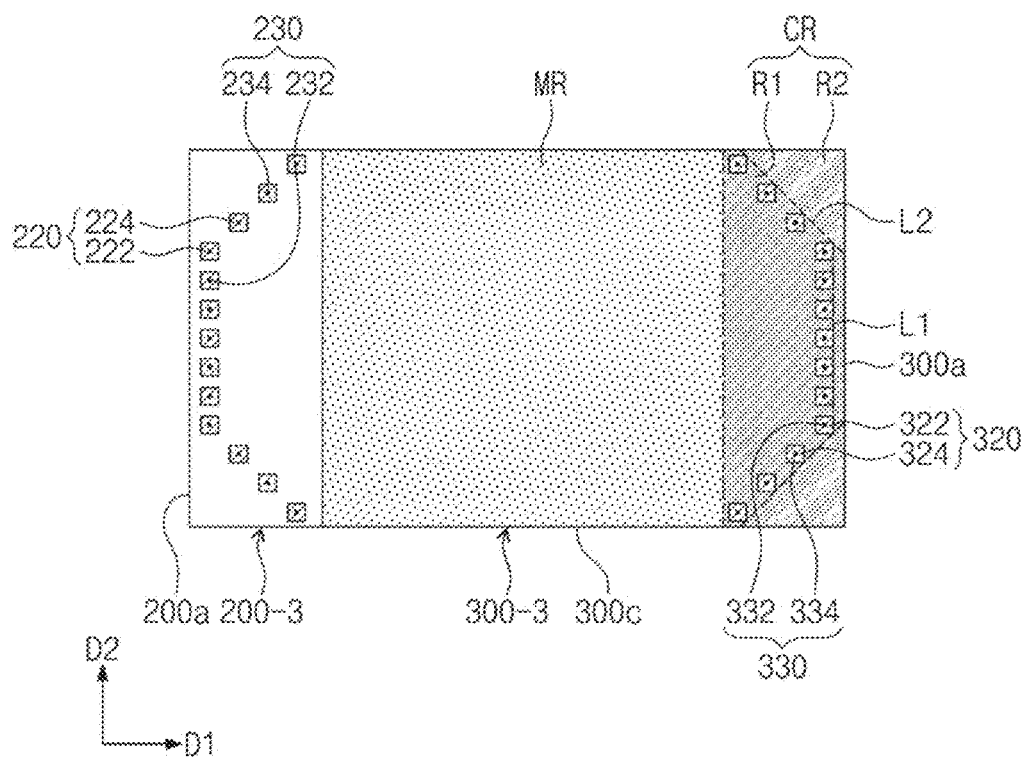

FIG. 6 illustrates a cross-sectional view showing a semiconductor package according to some example embodiments of the present inventive concepts. FIGS. 7 to 9 illustrate plan views showing a semiconductor package according to some example embodiments of the present inventive concepts. FIG. 7 shows lowermost first and second semiconductor chips of a semiconductor package. FIG. 8 shows intermediate first and second semiconductor chips of a semiconductor package. FIG. 9 shows uppermost first and second semiconductor chips of a semiconductor package.

Referring to FIG. 6, each of the first and second semiconductor chips 200 and 300 may be provided in plural. In the example embodiment of FIGS. 6 to 9, there are illustrated three first semiconductor chips 200-1, 200-2, and 200-3 and three second semiconductor chips 300-1, 300-2, and 300-3, but the present inventive concepts are not limited thereto.

The first semiconductor chips 200-1, 200-2, and 200-3 and the second semiconductor chips 300-1, 300-2, and 300-3 may be stacked alternately with each other. The first semiconductor chips 200-1, 200-2, and 200-3 may be aligned in the third direction D3. For example, the first semiconductor chips 200-1, 200-2, and 200-3 may have lateral surfaces (each of which corresponds to the first lateral surface 200a of FIG. 2) in a direction opposite to the first direction D1, and the lateral surfaces of the first semiconductor chips 200-1, 200-2, and 200-3 may be positioned on the same plane. The second semiconductor chips 300-1, 300-2, and 300-3 may be aligned in the third direction D3. For example, the second semiconductor chips 300-1, 300-2, and 300-3 may have lateral surfaces (each of which corresponds to the third lateral surface 300a of FIG. 2) in the first direction D1, and the lateral surfaces of the second semiconductor chips 300-1, 300-2, and 300-3 may be positioned on the same plane. In this configuration, the first semiconductor chips 200-1, 200-2, and 200-3 may protrude the same distance in a direction opposite to the first direction D1 from their adjacent second semiconductor chips 300-1, 300-2, and 300-3, and the second semiconductor chips 300-1, 300-2, and 300-3 may protrude the same distance in the first direction D1 from their adjacent first semiconductor chips 200-1, 200-2, and 200-3. The first semiconductor chips 200-1, 200-2, and 200-3 may have their connection regions whose areas are the same as each other. The second semiconductor chips 300-1, 300-2, and 300-3 may have their connection regions CR whose areas are the same as each other.

Each of the first semiconductor chips 200-1, 200-2, and 200-3 may be the same as or similar to the first semiconductor chip 200 discussed with reference to FIGS. 1 to 3. For example, the first semiconductor chips 200-1, 200-2, and 200-3 may have third unit pads 222 arranged along the first lateral surface 200a and fourth unit pads 224 disposed adjacent to corners of the first semiconductor chips 200-1, 200-2, and 200-3.

Each of the second semiconductor chips 300-1, 300-2, and 300-3 may be the same as or similar to the second semiconductor chip 300 discussed with reference to FIGS. 1 to 3. For example, the second semiconductor chips 300-1, 300-2, and 300-3 may have first unit pads 322 arranged along the first line L1 on the first region R1 and second unit pads 324 arranged along the second lines L2 on the first region R1.

Referring to FIGS. 6 to 9, an increase in distance between the package substrate 100 and the second semiconductor chips 300-1, 300-2, and 300-3 may induce an increase in area of the second regions R2 on the connection region CR. For example, an increase in distance between the package substrate 100 and the second semiconductor chips 300-1, 300-2, and 300-3 may induce a reduction in length of the first line L1 and an increase in length of the second lines L2. Alternatively, an increase in distance between the package substrate 100 and the second semiconductor chips 300-1, 300-2, and 300-3 may induce an increase in distance between the second lines L2 and corners of the second semiconductor chips 300-1, 300-2, and 300-3. An increase in distance between the package substrate 100 and the second semiconductor chips 300-1, 300-2, and 300-3 may induce a reduction in the number of the first unit pads 322 adjacent to the third lateral surface 300a and an increase in the number of the second unit pads 324 far away from the third lateral surface 300a. An increase in distance between the package substrate 100 and the second semiconductor chips 300-1, 300-2, and 300-3 may induce an increase in distance between the third lateral surface 300a and the second unit pads 324. For example, an increase in distance between the package substrate 100 and the second semiconductor chips 300-1, 300-2, and 300-3 may induce an increase in distance between the second chip pads 320 and corners of the second semiconductor chips 300-1, 300-2, and 300-3.

The second semiconductor chips 300-1, 300-2, and 300-3 may be wire-bonded to the package substrate 100. The second semiconductor chips 300-1, 300-2, and 300-3 may be connected through the second bonding wires 330 to the package substrate 100.

The second bonding wires 330 may include first sub-wires 332 coupled to the first unit pads 322 and second sub-wires 334 coupled to the second unit pads 324. Based on positions of the second unit pads 324, an increase in distance between the package substrate 100 and the second semiconductor chips 300-1, 300-2, and 300-3 may induce an increase in distance between the third lateral surface 300a and bonding positions of the second sub-wires 334 to the second unit pads 324.

An arrangement and shape of the first semiconductor chips 200-1, 200-2, and 200-3 may be the same as or similar to an arrangement and shape of the second semiconductor chips 300-1, 300-2, and 300-3. For example, an increase in distance between the package substrate 100 and the first semiconductor chips 200-1, 200-2, and 200-3 may induce an increase in area of chamfer regions on corners of the first semiconductor chips 200-1, 200-2, and 200-3. An increase in distance between the package substrate 100 and the first semiconductor chips 200-1, 200-2, and 200-3 may induce a reduction in the number of the third unit pads 222 adjacent to the first lateral surface 200a and an increase in the number of the fourth unit pads 224 far away from the first lateral surface 200a. An increase in distance between the package substrate 100 and the first semiconductor chips 200-1, 200-2, and 200-3 may induce an increase in distance between the first lateral surface 200a and the fourth unit pads 224. For example, an increase in distance between the package substrate 100 and the first semiconductor chips 200-1, 200-2, and 200-3 may induce an increase in distance between the first chip pads 220 and corners of the first semiconductor chips 200-1, 200-2, and 200-3.

The first semiconductor chips 200-1, 200-2, and 200-3 may be wire-bonded to the package substrate 100. The first semiconductor chips 200-1, 200-2, and 200-3 may be connected through the first bonding wires 230 to the package substrate 100.

The first bonding wires 230 may include third sub-wires 232 coupled to the third unit pads 222 and fourth sub-wires 234 coupled to the fourth unit pads 224. Based on positions of the fourth unit pads 224, an increase in distance between the package substrate 100 and the first semiconductor chips 200-1, 200-2, and 200-3 may induce an increase in distance between the first lateral surface 200a and bonding positions of the fourth sub-wires 234 to the fourth unit pads 224.

In general, an increase in distance between semiconductor chips and the package substrate 100 may induce an increase in pressure and torque applied to the semiconductor chips in a wire bonding process of semiconductor package fabrication.

According to some example embodiments of the present inventive concepts, an increase in distance between the package substrate 100 and the semiconductor chips 200-1, 300-1, 200-2, 300-2, 200-3, and 300-3 may induce an increase in area of the second regions R2 or sections where no pads are provided on corners of the semiconductor chips 200-1, 300-1, 200-2, 300-2, 200-3, and 300-3. Therefore, in a wire bonding process of semiconductor package fabrication, there may be a reduction in pressure and torque applied to high-level placed ones of the semiconductor chips 200-1, 300-1, 200-2, 300-2, 200-3, and 300-3. Accordingly, a semiconductor package may not be damaged during fabrication thereof and may be provided with structural stability.

Figure 10:
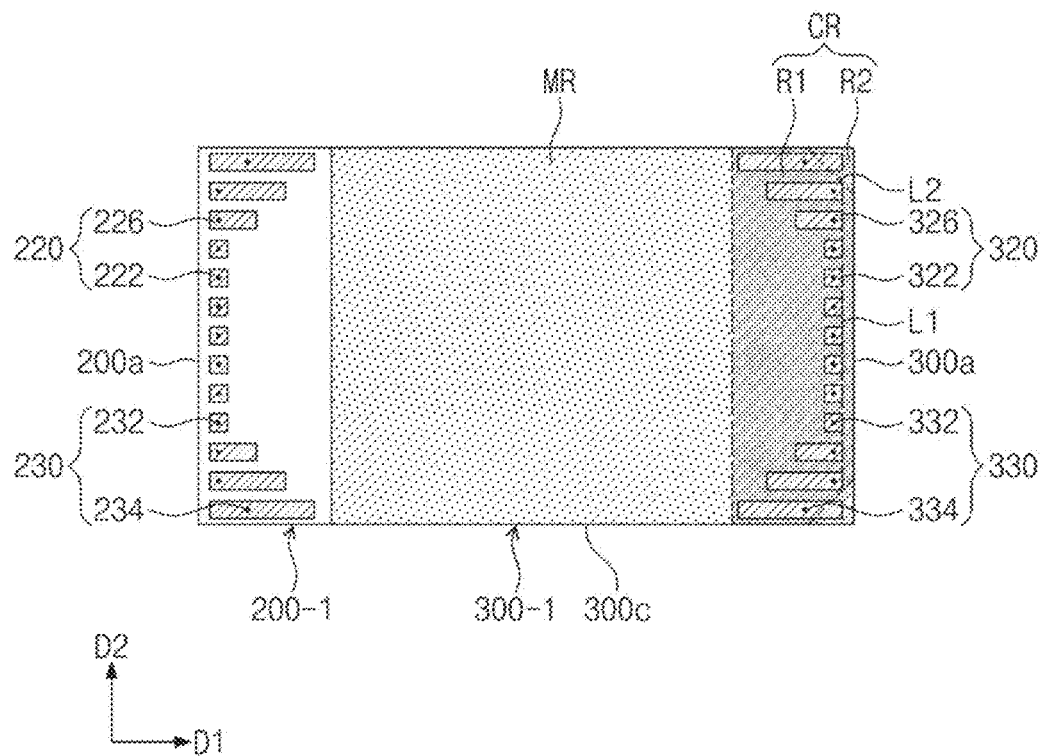
Figure 11:
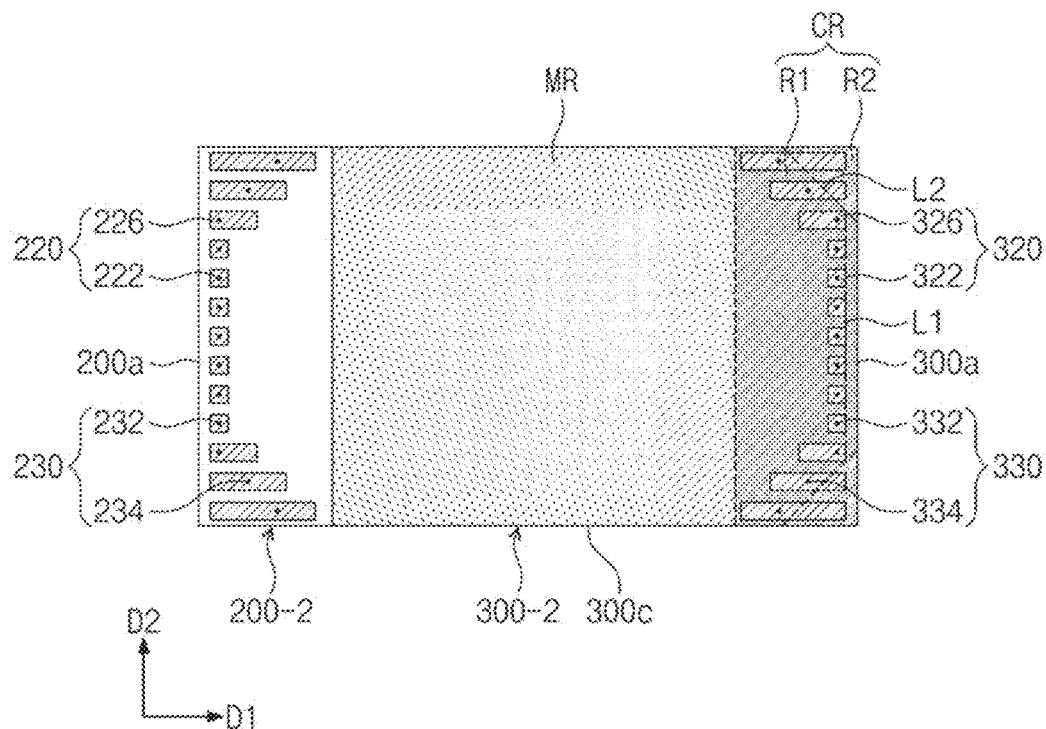
Figure 12:
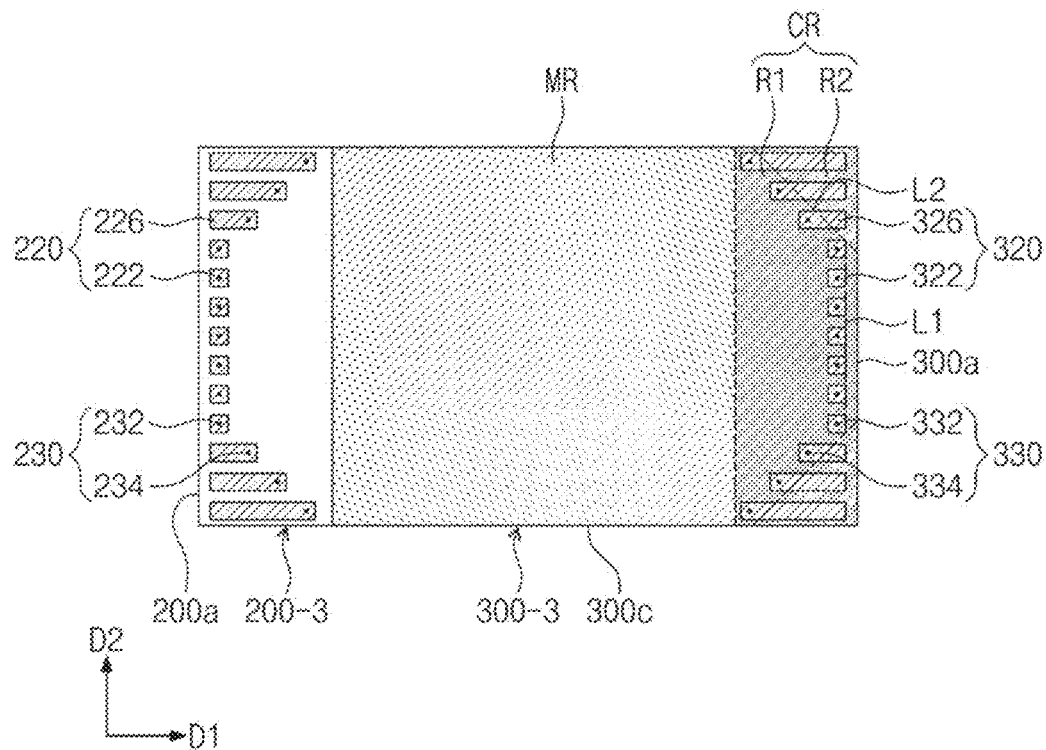

FIGS. 10 to 12 illustrate plan views showing a semiconductor package according to some example embodiments of the present inventive concepts. FIG. 10 shows lowermost first and second semiconductor chips of a semiconductor package. FIG. 11 shows intermediate first and second semiconductor chips of a semiconductor package. FIG. 12 shows uppermost first and second semiconductor chips of a semiconductor package.

Referring to FIG. 6, each of the first semiconductor chips 200-1, 200-2, and 200-3 may be the same as or similar to the first semiconductor chip 200 discussed with reference to FIGS. 1 and 4. For example, the first semiconductor chips 200-1, 200-2, and 200-3 may have third unit pads 222 arranged along the first lateral surface 200a and sixth unit pads 226 disposed adjacent to corners of the first semiconductor chips 200-1, 200-2, and 200-3. Each of the sixth unit pads 226 may extend toward the first lateral surface 200a. The first semiconductor chips 200-1, 200-2, and 200-3 may have the same configuration and arrangement of the first chip pads 220. For example, the first semiconductor chips 200-1, 200-2, and 200-3 may be the same chips.

Each of the second semiconductor chips 300-1, 300-2, and 300-3 may be the same as or similar to the second semiconductor chip 300 discussed with reference to FIGS. 1 and 4. For example, the second semiconductor chips 300-1, 300-2, and 300-3 may have first unit pads 322 arranged along the first line L1 on the first region R1 and fifth unit pads 326 arranged along the second lines L2 on the first region RE The fifth unit pads 326 may be arranged along the second lines L2 on the first region R1, and each of the fifth unit pads 326 may extend onto the second region R2. The second semiconductor chips 300-1, 300-2, and 300-3 may have the same configuration and arrangement of the second chip pads 320. For example, the second semiconductor chips 300-1, 300-2, and 300-3 may be the same chips.

Referring to FIGS. 6 and 10 to 12, an increase in distance between the package substrate 100 and the second semiconductor chips 300-1, 300-2, and 300-3 may induce an increase in area of the second regions R2 on the connection region CR. In this description, regions on semiconductor chips may indicate arbitrary regions, and the fact that the semiconductor chips have different sized regions may not mean that the semiconductor chips have different shapes and configurations. An increase in distance between the package substrate 100 and the second semiconductor chips 300-1, 300-2, and 300-3 may induce a reduction in length of the first line L1 and an increase in length of the second lines L2. Alternatively, an increase in distance between the package substrate 100 and the second semiconductor chips 300-1, 300-2, and 300-3 may induce an increase in distance between the second lines L2 and corners of the second semiconductor chips 300-1, 300-2, and 300-3.

The second semiconductor chips 300-1, 300-2, and 300-3 may be wire-bonded to the package substrate 100. The second semiconductor chips 300-1, 300-2, and 300-3 may be connected through the second bonding wires 330 to the package substrate 100.

The second bonding wires 330 may include first sub-wires 332 coupled to the first unit pads 322 and second sub-wires 334 coupled to the fifth unit pads 326. In this case, an increase in distance between the package substrate 100 and the second semiconductor chips 300-1, 300-2, and 300-3 may induce an increase in distance between the third lateral surface 300a and bonding positions of the second sub-wires 334 to the fifth unit pads 326. For example, the bonding positions of the second sub-wires 334 to the fifth unit pads 326 may be positioned along the second lines L2.

An arrangement and shape of the first semiconductor chips 200-1, 200-2, and 200-3 may be the same as or similar to an arrangement and shape of the second semiconductor chips 300-1, 300-2, and 300-3. For example, an increase in distance between the package substrate 100 and the first semiconductor chips 200-1, 200-2, and 200-3 may induce an increase in area of chamfer regions on corners of the first semiconductor chips 200-1, 200-2, and 200-3.

The first semiconductor chips 200-1, 200-2, and 200-3 may be wire-bonded to the package substrate 100. The first semiconductor chips 200-1, 200-2, and 200-3 may be connected through the first bonding wires 230 to the package substrate 100.

The first bonding wires 230 may include third sub-wires 232 coupled to the third unit pads 222 and fourth sub-wires 234 coupled to the sixth unit pads 226. Based on positions of the sixth unit pads 226, an increase in distance between the package substrate 100 and the first semiconductor chips 200-1, 200-2, and 200-3 may induce an increase in distance between the first lateral surface 200a and bonding positions of the fourth sub-wires 234 to the sixth unit pads 226.

According to some example embodiments of the present inventive concepts, an increase in distance between the package substrate 100 and the semiconductor chips 200-1, 300-1, 200-2, 300-2, 200-3, and 300-3 may induce an increase in distance of bonding positions of the bonding wires 230 and 330 between corners of the semiconductor chips 200-1, 300-1, 200-2, 300-2, 200-3, and 300-3. In addition, as the semiconductor chips 200-1, 300-1, 200-2, 300-2, 200-3, and 300-3 have large area pads 226 and 326 adjacent to corners thereof, it may be possible to stack the same semiconductor chips 200-1, 300-1, 200-2, 300-2, 200-3, and 300-3 and simultaneously to allow the semiconductor chips 200-1, 300-1, 200-2, 300-2, 200-3, and 300-3 to have different bonding positions. Therefore, it may be possible to reduce pressure and torque applied to high-level placed ones of the semiconductor chips 200-1, 300-1, 200-2, 300-2, 200-3, and 300-3 while stacking the same semiconductor chips 200-1, 300-1, 200-2, 300-2, 200-3, and 300-3. Accordingly, a semiconductor package may not be damaged during fabrication thereof and may be provided with structural stability.

Figure 13:
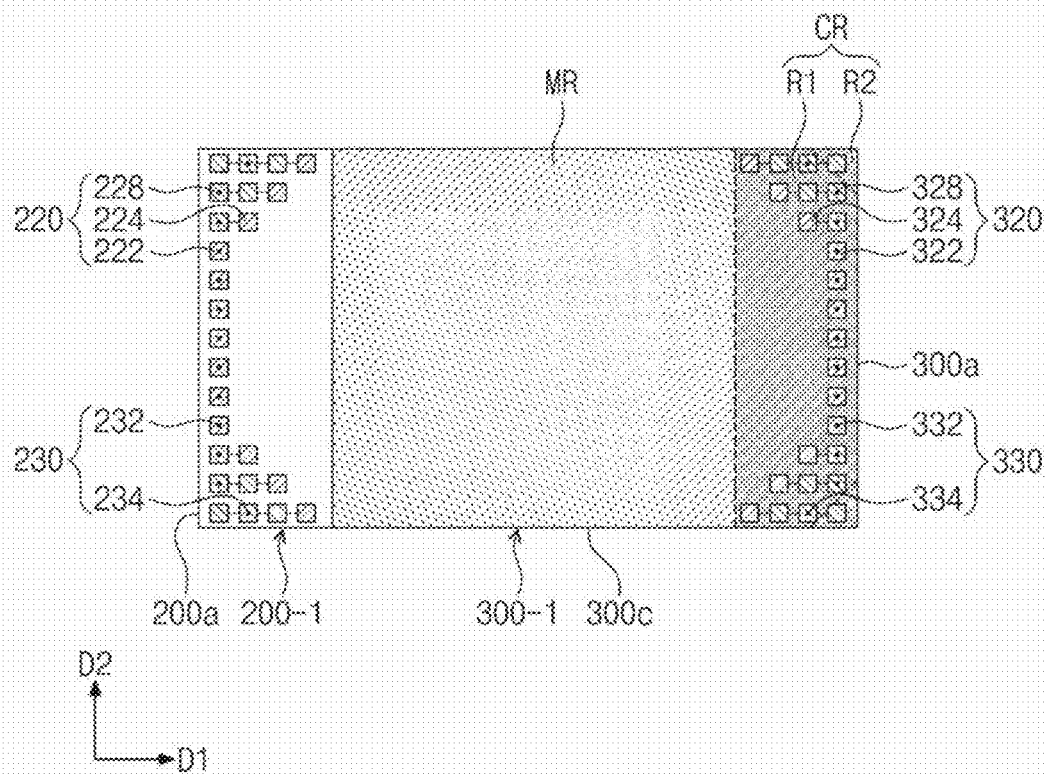
Figure 14:
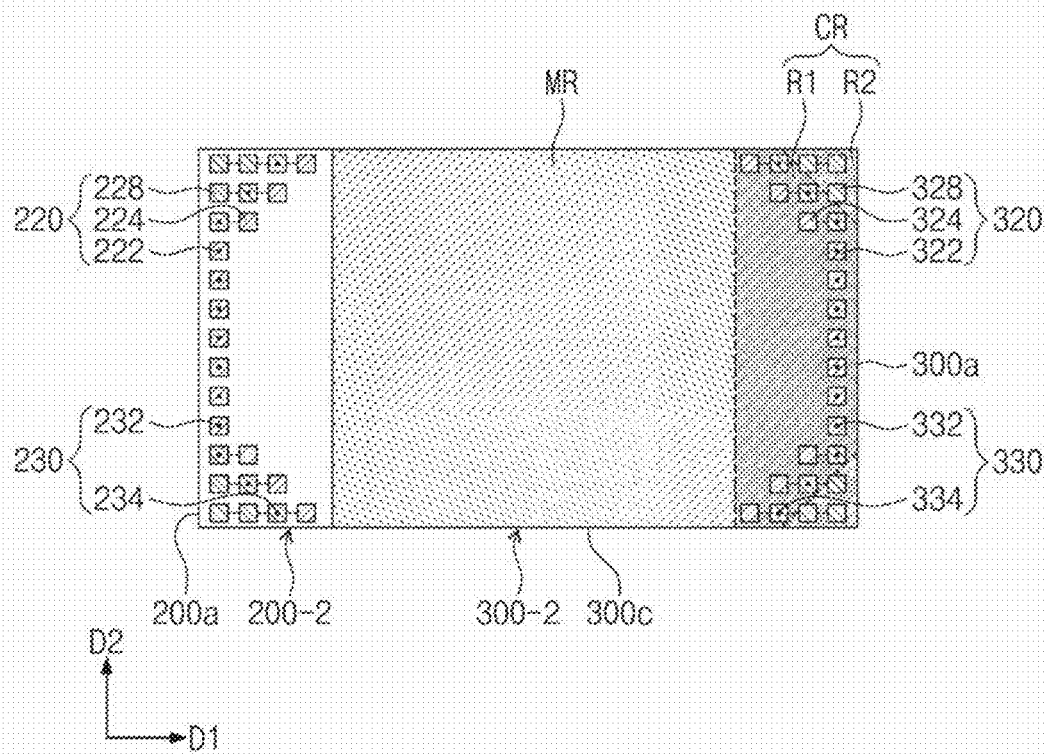
Figure 15:
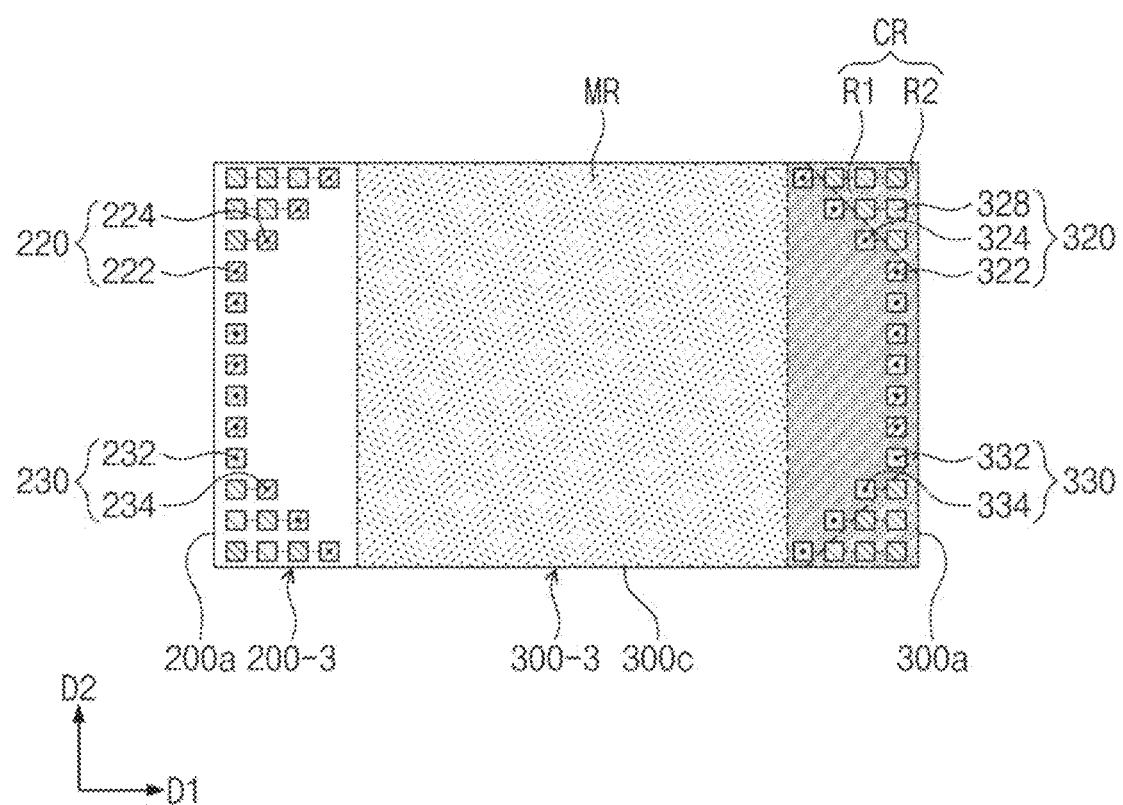

FIGS. 13 to 15 illustrate plan views showing a semiconductor package according to some example embodiments of the present inventive concepts. FIG. 13 shows lowermost first and second semiconductor chips of a semiconductor package. FIG. 14 shows intermediate first and second semiconductor chips of a semiconductor package. FIG. 15 shows uppermost first and second semiconductor chips of a semiconductor package.

Referring to FIG. 6, each of the first semiconductor chips 200-1, 200-2, and 200-3 may be the same as or similar to the first semiconductor chip 200 discussed with reference to FIGS. 1 and 5. For example, the first semiconductor chips 200-1, 200-2, and 200-3 may have third unit pads 222 arranged along the first lateral surface 200a, fourth unit pads 224 disposed adjacent to corners of the first semiconductor chips 200-1, 200-2, and 200-3, and second dummy pads 228 provided in a direction opposite to the first direction D1 of the fourth unit pads 224. A single pad group may be constituted by one fourth unit pad 224 and at least one second dummy pad 228 that is arranged in a direction opposite to the first direction D1 of the one fourth unit pad 224. The first semiconductor chips 200-1, 200-2, and 200-3 may have the same configuration and arrangement of the first chip pads 220. For example, the first semiconductor chips 200-1, 200-2, and 200-3 may be the same chips.

Each of the second semiconductor chips 300-1, 300-2, and 300-3 may be the same as or similar to the second semiconductor chip 300 discussed with reference to FIGS. 1 and 5. For example, the second semiconductor chips 300-1, 300-2, and 300-3 may have first unit pads 322 arranged along the first line L1 on the first region R1, second unit pads 324 arranged along the second lines L2 on the first region R1, and first dummy pads 328 disposed on the second regions R2. A single pad group may be constituted by one second unit pad 324 and at least one first dummy pad 328 that is disposed in the first direction D1 of the one second unit pad 324. The second semiconductor chips 300-1, 300-2, and 300-3 may have the same configuration and arrangement of the second chip pads 320. For example, the second semiconductor chips 300-1, 300-2, and 300-3 may be the same chips.

Referring to FIGS. 6 and 13 to 15, an increase in distance between the package substrate 100 and the second semiconductor chips 300-1, 300-2, and 300-3 may induce an increase in area of the second regions R2 on the connection region CR. An increase in distance between the package substrate 100 and the second semiconductor chips 300-1, 300-2, and 300-3 may induce a reduction in length of the first line L1 and an increase in length of the second lines L2. Alternatively, an increase in distance between the package substrate 100 and the second semiconductor chips 300-1, 300-2, and 300-3 may induce an increase in distance between the second lines L2 and corners of the second semiconductor chips 300-1, 300-2, and 300-3.

The second semiconductor chips 300-1, 300-2, and 300-3 may be wire-bonded to the package substrate 100. The second semiconductor chips 300-1, 300-2, and 300-3 may be connected through the second bonding wires 330 to the package substrate 100.

The second bonding wires 330 may include first sub-wires 332 coupled to the first unit pads 322, and may also include second sub-wires 334 coupled to one of the first dummy pads 328 and the second unit pad 324 of the one pad group. In this case, an increase in distance between the package substrate 100 and the second semiconductor chips 300-1, 300-2, and 300-3 may induce an increase in distance between the third lateral surface 300a and bonding positions of the second sub-wires 334 to the first dummy pads 328 and the second unit pads 324 of the pad groups. For example, the bonding positions of the second sub-wires 334 to the to the first dummy pads 328 and the second unit pads 324 of the pad group may be positioned along the second lines L2.

An arrangement and shape of the first semiconductor chips 200-1, 200-2, and 200-3 may be the same as or similar to an arrangement and shape of the second semiconductor chips 300-1, 300-2, and 300-3. For example, an increase in distance between the package substrate 100 and the first semiconductor chips 200-1, 200-2, and 200-3 may induce an increase in area of chamfer regions on corners of the first semiconductor chips 200-1, 200-2, and 200-3.

The first semiconductor chips 200-1, 200-2, and 200-3 may be wire-bonded to the package substrate 100. The first semiconductor chips 200-1, 200-2, and 200-3 may be connected through the first bonding wires 230 to the package substrate 100.

The first bonding wires 230 may include third sub-wires 232 coupled to the third unit pads 222, and may also include fourth sub-wires 234 coupled to one of the second dummy pads 228 and the fourth unit pad 224 of the one pad group. In this case, an increase in distance between the package substrate 100 and the first semiconductor chips 200-1, 200-2, and 200-3 may induce an increase in distance between the first lateral surface 200a and bonding positions of the fourth sub-wires 234 to the second dummy pads 228 and the fourth unit pads 224 of the pad groups.

According to some example embodiments of the present inventive concepts, as the semiconductor chips 200-1, 300-1, 200-2, 300-2, 200-3, and 300-3 have the pads 224 and 324 and the dummy pads 228 and 328 connected to the pads 224 and 324, it may be possible to stack the same semiconductor chips 200-1, 300-1, 200-2, 300-2, 200-3, and 300-3 and simultaneously to allow the semiconductor chips 200-1, 300-1, 200-2, 300-2, 200-3, and 300-3 to have different bonding positions. Therefore, it may be possible to reduce pressure and torque applied to high-level placed ones of the semiconductor chips 200-1, 300-1, 200-2, 300-2, 200-3, and 300-3 while stacking the same semiconductor chips 200-1, 300-1, 200-2, 300-2, 200-3, and 300-3. Accordingly, a semiconductor package may not be damaged during fabrication thereof and may be provided with structural stability.

Figure 16:
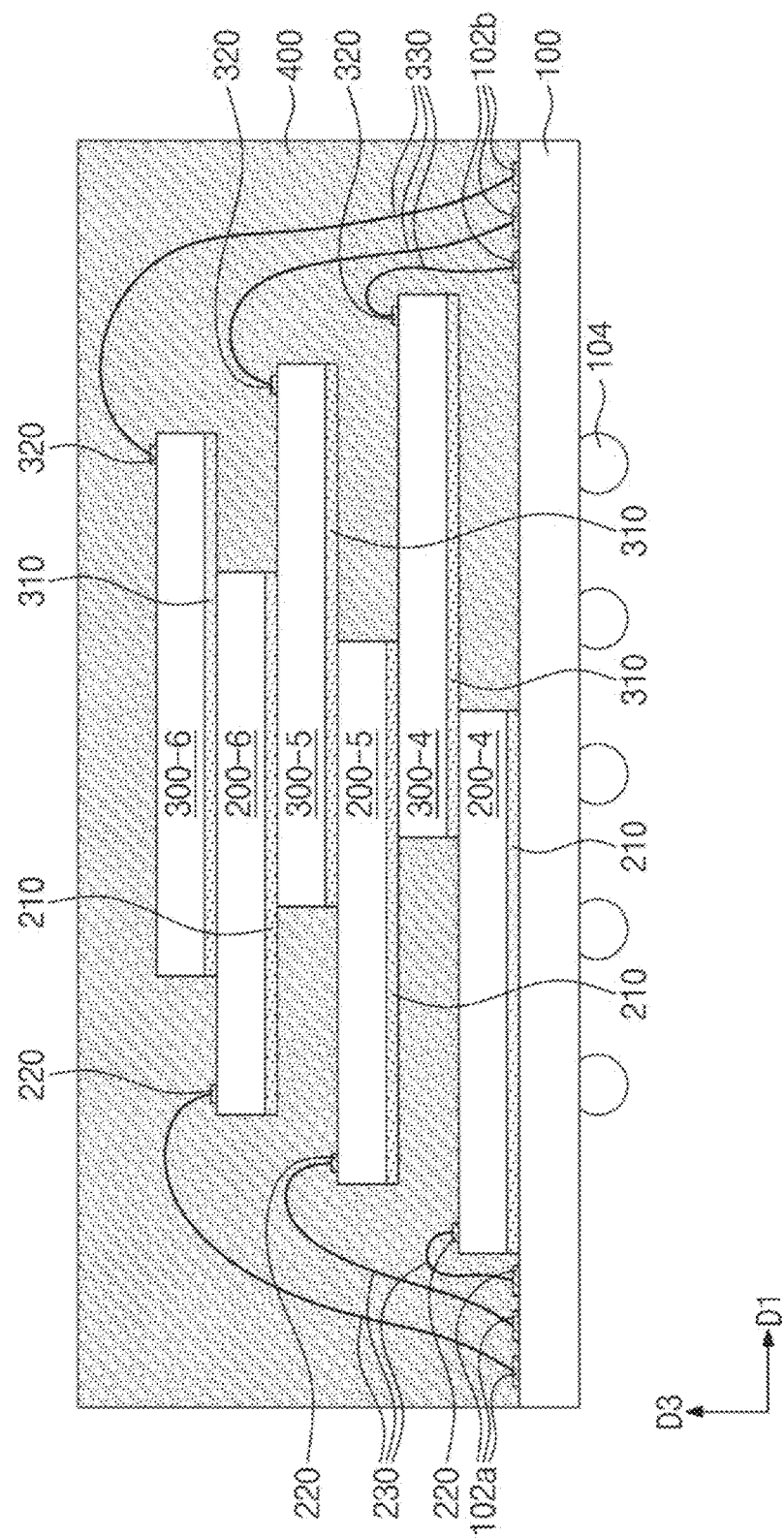
FIGS. 16 and 17 illustrate cross-sectional views showing a semiconductor package according to some example embodiments of the present inventive concepts.
Figure 17:
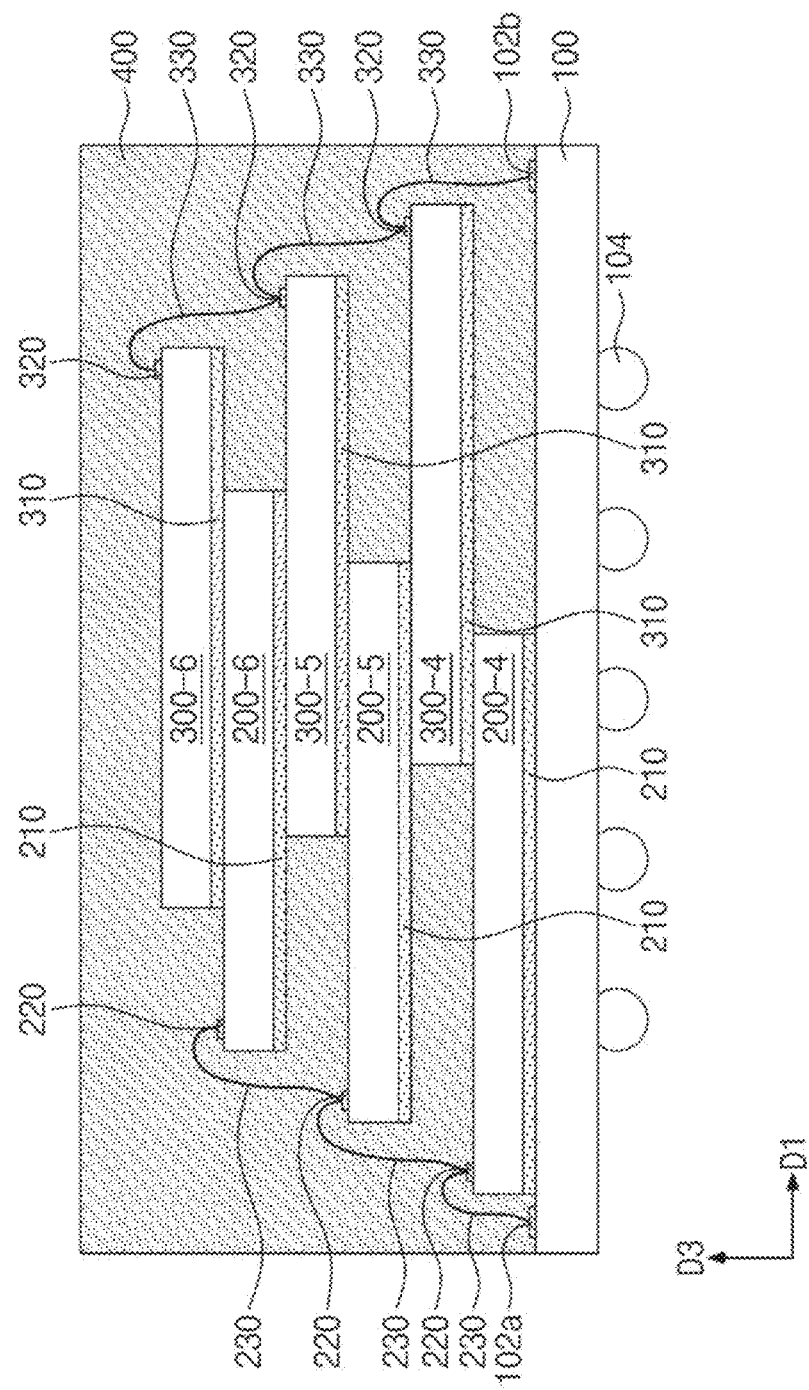
Figure 18:
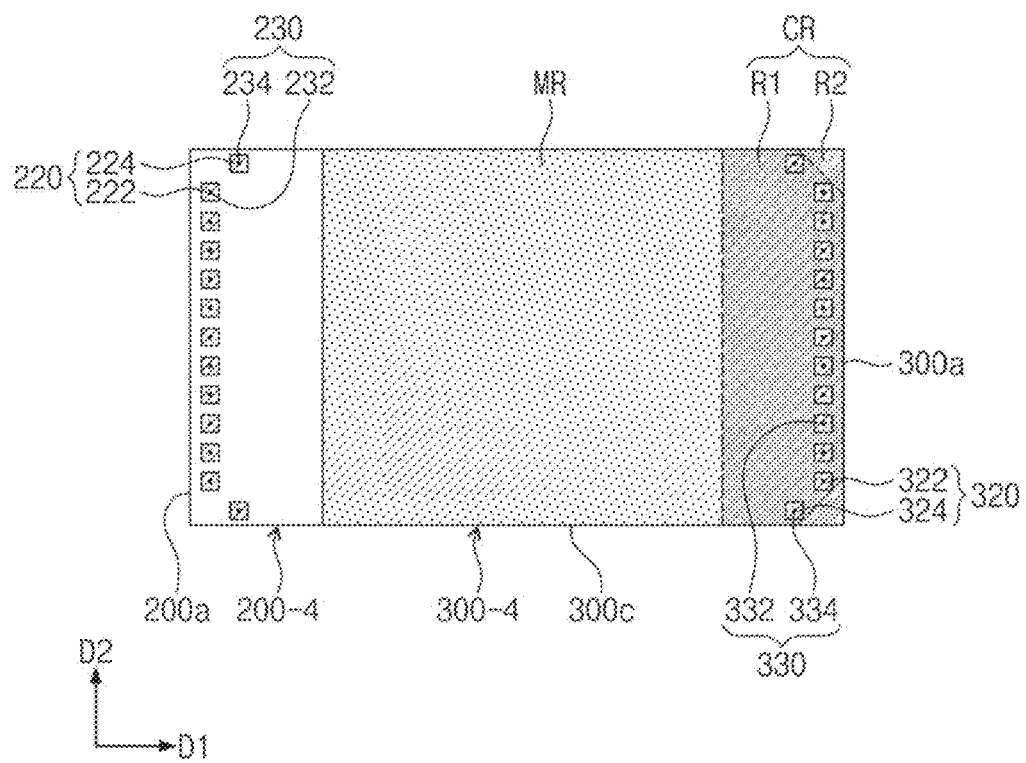
Figure 19:
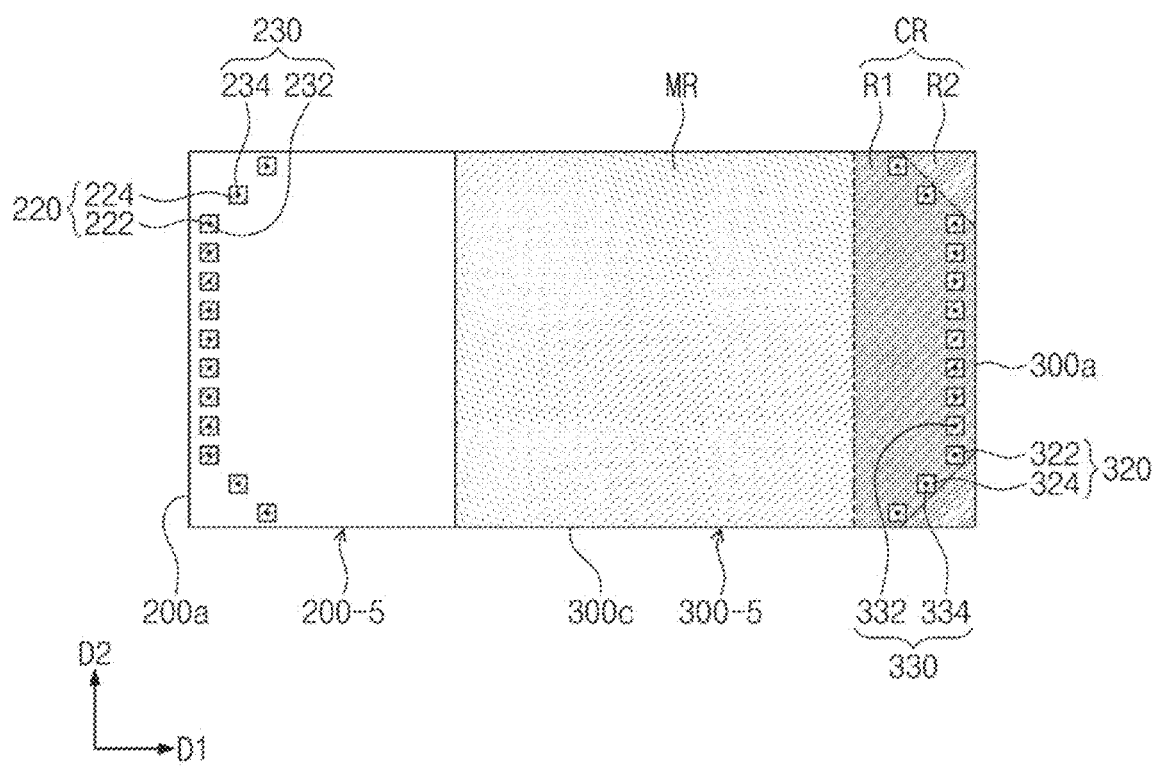

FIGS. 16 and 17 illustrate cross-sectional views showing a semiconductor package according to some example embodiments of the present inventive concepts. FIGS. 18 to 20 illustrate plan views showing a semiconductor package according to some example embodiments of the present inventive concepts.

Referring to FIGS. 16 and 17, each of the first and second semiconductor chips 200 and 300 may be provided in plural. The first semiconductor chips 200-4, 200-5, and 200-6 and the second semiconductor chips 300-4, 300-5, and 300-6 may be stacked alternately with each other. In this case, an increase in distance between the package substrate 100 and the first semiconductor chips 200-4, 200-5, and 200-6 may induce a reduction in protruding length in a direction opposite to the first direction D1 of the first semiconductor chips 200-4, 200-5, and 200-6 from overlying second semiconductor chips 300-4, 300-5, and 300-6. An increase in distance between the package substrate 100 and the second semiconductor chips 300-4, 300-5, and 300-6 may induce a reduction in protruding length in the first direction D1 of the second semiconductor chips 300-4, 300-5, and 300-6 from underlying first semiconductor chips 200-4, 200-5, and 200-6. For example, the first semiconductor chips 200-4, 200-5, and 200-6 may be stacked in a cascade shape, and the second semiconductor chips 300-4, 300-5, and 300-6 may be stacked in a cascade shape. An increase in distance between the package substrate 100 and the first semiconductor chips 200-4, 200-5, and 200-6 may induce a reduction in area of the connection regions of the first semiconductor chips 200-4, 200-5, and 200-6. An increase in distance between the package substrate 100 and the second semiconductor chips 300-4, 300-5, and 300-6 may induce a reduction in area of the connection regions CR of the second semiconductor chips 300-4, 300-5, and 300-6. The present inventive concepts, however, are not limited thereto. The example embodiment of FIGS. 16 to 20 is provided to explain a semiconductor package in which semiconductor chips have different protruding lengths. In the example embodiment of FIGS. 16 to 20, the first and second semiconductor chips 200-4 and 300-4 may have larger protruding lengths, the first and second semiconductor chips 200-6 and 300-6 may have smaller protruding lengths, and the first and second semiconductor chips 200-5 and 300-5 may have medium protruding lengths.

Referring to FIGS. 16 to 20, an increase in protruding length of the second semiconductor chips 300-4, 300-5, and 300-6 from the first semiconductor chips 200-4, 200-5, and 200-6 may induce an increase in area of the second regions R2 on the connection region CR. For example, an increase in protruding length of the second semiconductor chips 300-4, 300-5, and 300-6 from the first semiconductor chips 200-4, 200-5, and 200-6 may induce a reduction in length of the first line L1 and an increase in length of the second lines L2. Alternatively, an increase in protruding length of the second semiconductor chips 300-4, 300-5, and 300-6 from the first semiconductor chips 200-4, 200-5, and 200-6 may induce an increase in distance between the second lines L2 and corners of the second semiconductor chips 300-4, 300-5, and 300-6. An increase in protruding length of the second semiconductor chips 300-4, 300-5, and 300-6 from the first semiconductor chips 200-4, 200-5, and 200-6 may induce a reduction in the number of the first unit pads 322 adjacent to the third lateral surface 300a and an increase in the number of the second unit pads 324 far away from the third lateral surface 300a. An increase in protruding length of the second semiconductor chips 300-4, 300-5, and 300-6 from the first semiconductor chips 200-4, 200-5, and 200-6 may induce an increase in distance between the third lateral surface 300a and the second unit pads 324. For example, an increase in protruding length of the second semiconductor chips 300-4, 300-5, and 300-6 from the first semiconductor chips 200-4, 200-5, and 200-6 may induce an increase in distance between the second chip pads 320 and corners of the second semiconductor chips 300-4, 300-5, and 300-6.

The second semiconductor chips 300-4, 300-5, and 300-6 may be wire-bonded to the package substrate 100. As shown in FIG. 16, each of the second semiconductor chips 300-4, 300-5, and 300-6 may be connected through the second bonding wires 330 to the package substrate 100. For example, each of the second bonding wires 330 may connect one of the second chip pads 320 of the second semiconductor chips 300-4, 300-5, and 300-6 to one of the second substrate pads 102b of the package substrate 100. Alternatively, as shown in FIG. 17, the package substrate 100 and the second semiconductor chips 300-4, 300-5, and 300-6 may be connected to each other through the second bonding wires 330. For example, each of the second bonding wires 330 may connect to each other the second chip pads 320 of the second semiconductor chips 300-4, 300-5, and 300-6, or may connect one of the second chip pads 320 to one of the second substrate pads 102b of the package substrate 100.

The second bonding wires 330 may include first sub-wires 332 coupled to the first unit pads 322 and second sub-wires 334 coupled to the second unit pads 324. Based on positions of the second unit pads 324, an increase in protruding length of the second semiconductor chips 300-4, 300-5, and 300-6 from the first semiconductor chips 200-4, 200-5, and 200-6 may induce an increase in distance between the third lateral surface 300a and bonding positions of the second sub-wires 334 to the second unit pads 324.

An arrangement and shape of the first semiconductor chips 200-4, 200-5, and 200-6 may be the same as or similar to an arrangement and shape of the second semiconductor chips 300-4, 300-5, and 300-6. For example, an increase in protruding length of the first semiconductor chips 200-4, 200-5, and 200-6 from the second semiconductor chips 300-4, 300-5, and 300-6 may induce an increase in area of chamfer regions on corners of the first semiconductor chips 200-4, 200-5, and 200-6. An increase in protruding length of the first semiconductor chips 200-4, 200-5, and 200-6 from the second semiconductor chips 300-4, 300-5, and 300-6 may induce a reduction in the number of the third unit pads 222 adjacent to the first lateral surface 200a and an increase in the number of the fourth unit pads 224 far away from the first lateral surface 200a. An increase in protruding length of the first semiconductor chips 200-4, 200-5, and 200-6 from the second semiconductor chips 300-4, 300-5, and 300-6 may induce an increase in distance between the first lateral surface 200a and the fourth unit pads 224. For example, an increase in protruding length of the first semiconductor chips 200-4, 200-5, and 200-6 from the second semiconductor chips 300-4, 300-5, and 300-6 may induce an increase in distance between the first chip pads 220 and corners of the first semiconductor chips 200-4, 200-5, and 200-6.

The first semiconductor chips 200-4, 200-5, and 200-6 may be wire-bonded to the package substrate 100. As shown in FIG. 16, each of the first semiconductor chips 200-4, 200-5, and 200-6 may be connected through the first bonding wires 230 to the package substrate 100. For example, each of the first bonding wires 230 may connect one of the first chip pads 220 of the first semiconductor chips 200-4, 200-5, and 200-6 to one of the first substrate pads 102a of the package substrate 100. Alternatively, as shown in FIG. 17, the package substrate 100 and the first semiconductor chips 200-4, 200-5, and 200-6 may be connected to each other through the first bonding wires 230. For example, each of the first bonding wires 230 may connect to each other the first chip pads 220 of the first semiconductor chips 200-4, 200-5, and 200-6, or may connect one of the first chip pads 220 to one of the first substrate pads 102a of the package substrate 100.

The first bonding wires 230 may include third sub-wires 232 coupled to the third unit pads 222 and fourth sub-wires 234 coupled to the fourth unit pads 224. Based on positions of the fourth unit pads 224, an increase in protruding length of the first semiconductor chips 200-4, 200-5, and 200-6 from the second semiconductor chips 300-4, 300-5, and 300-6 may induce an increase in distance between the first lateral surface 200a and bonding positions of the fourth sub-wires 234 to the fourth unit pads 224.

In general, an increase in protruding length of semiconductor chips from an adjacent other semiconductor chip may induce an increase in pressure and torque applied to the semiconductor chips in a wire bonding process of semiconductor package fabrication.

According to some example embodiments of the present inventive concepts, an increase in protruding length of the semiconductor chips 200-4, 300-4, 200-5, 300-5, 200-6, and 300-6 from an adjacent other semiconductor chip may induce an increase in area of the second regions R2 or sections where no pads are provided on corners of the semiconductor chips 200-4, 300-4, 200-5, 300-5, 200-6, and 300-6. Therefore, in a wire bonding process of semiconductor package fabrication, there may be a reduction in pressure and torque applied to the semiconductor chips 200-4, 300-4, 200-5, 300-5, 200-6, and 300-6 having large protruding lengths from an adjacent other semiconductor chip. Accordingly, a semiconductor package may not be damaged during fabrication thereof and may be provided with structural stability.

Figure 22A:
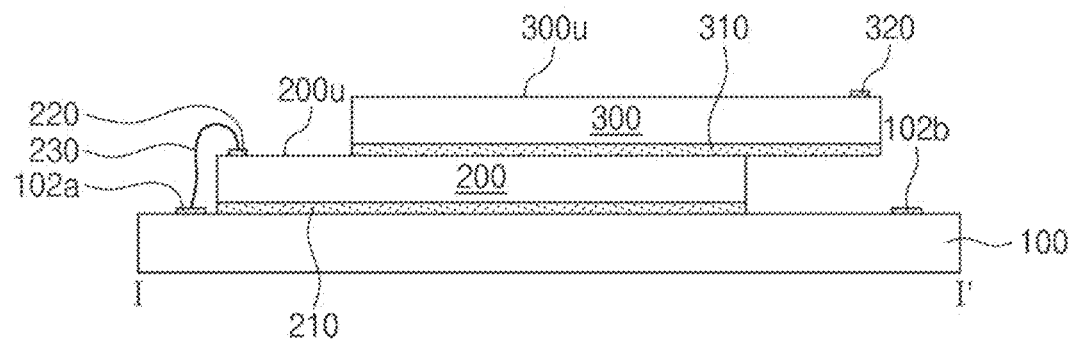
Figure 22B:
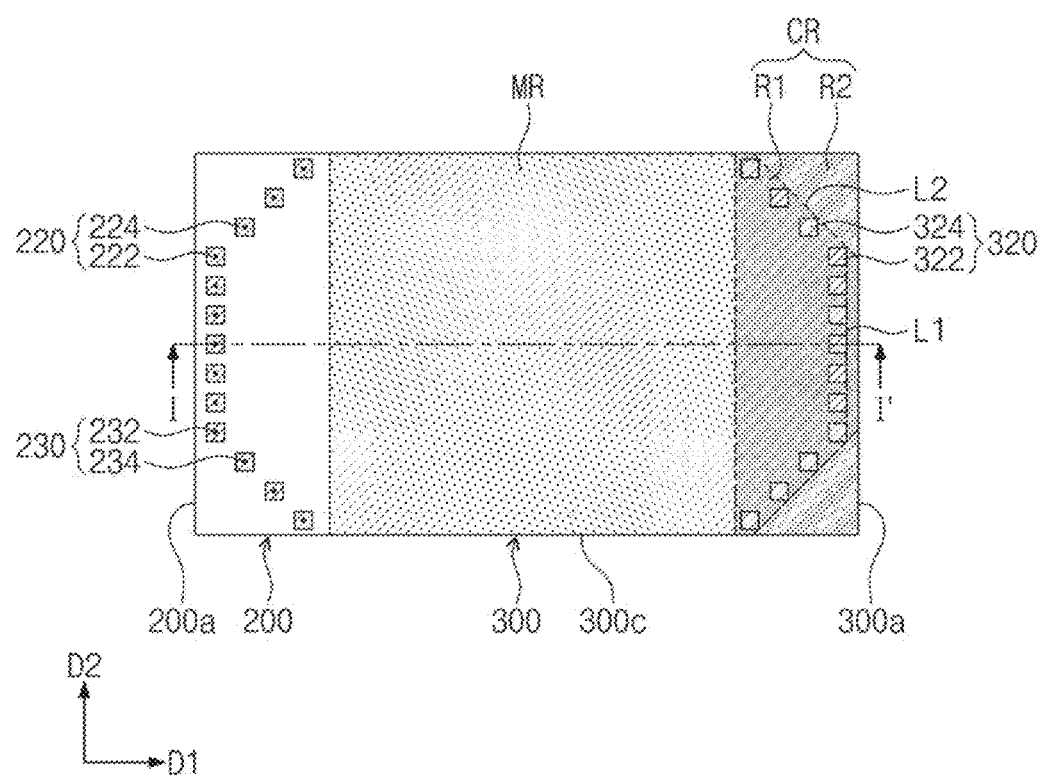
Figure 23A:
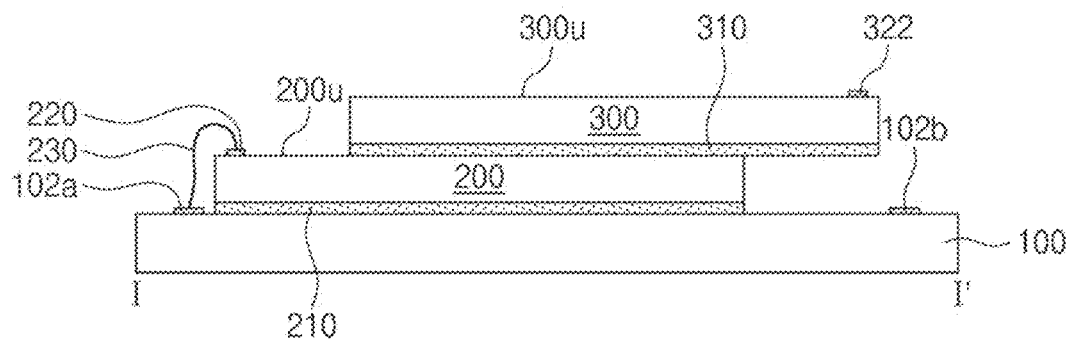
Figure 23B:
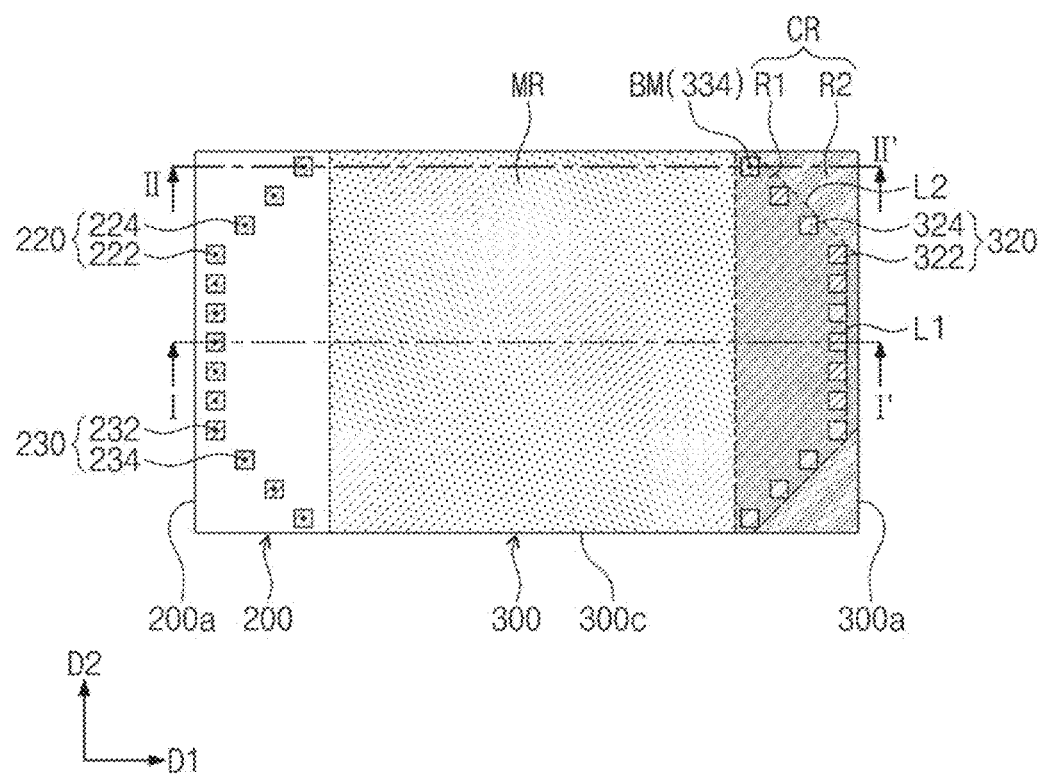
Figure 23C:
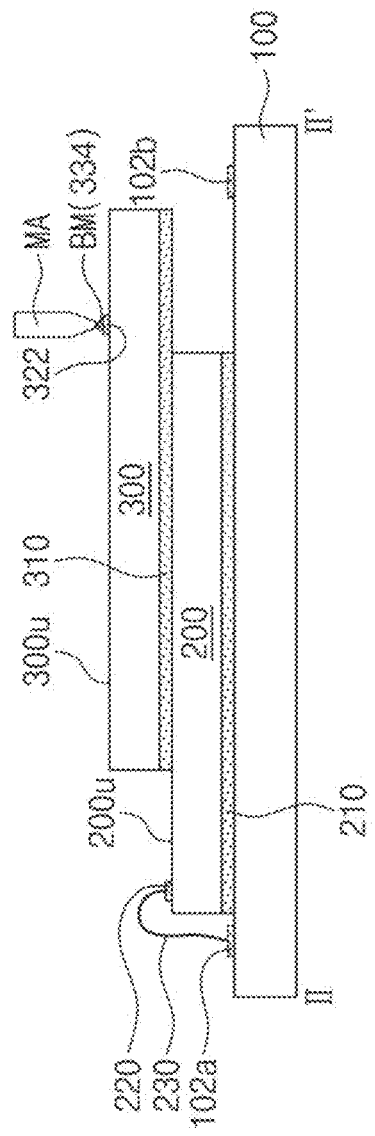

FIGS. 21A to 25A and 23C illustrate cross-sectional views showing a method of fabricating a semiconductor package according to some example embodiments of the present inventive concepts. FIGS. 21B to 25B illustrate plan views showing a method of fabricating a semiconductor package according to some example embodiments of the present inventive concepts. FIGS. 21A to 25A correspond to cross-sectional views taken along line I-I' of FIGS. 21B to 25B, respectively. FIG. 23C corresponds to a cross-sectional view taken along line II-II' of FIG. 23B.

Figure 21A:
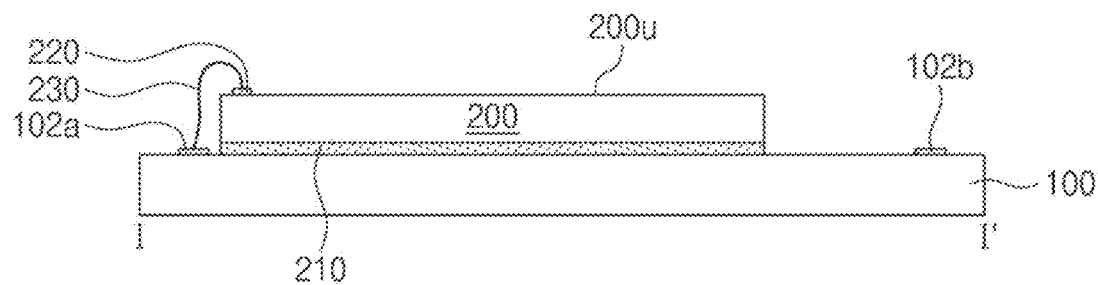
Figure 21B:
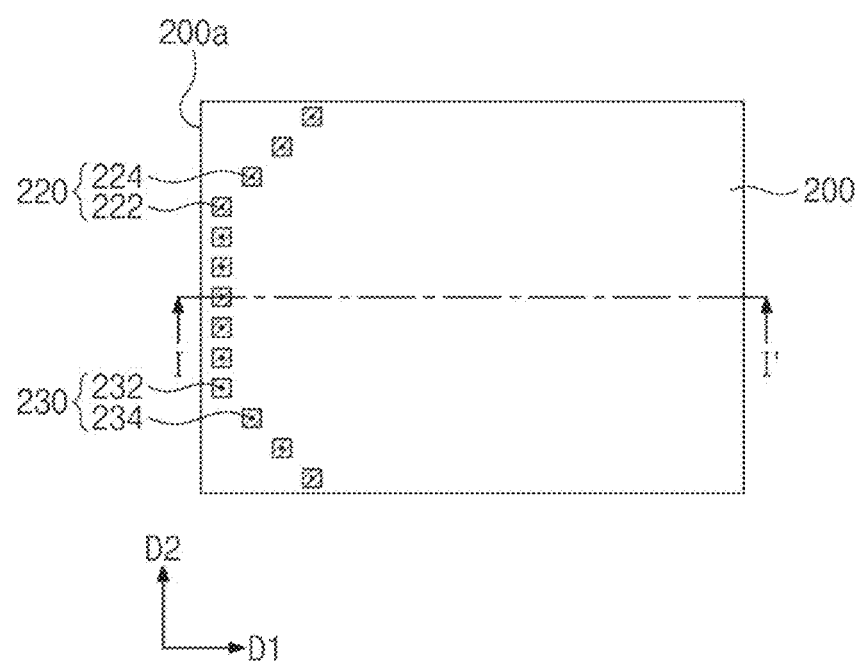

Referring to FIGS. 21A and 21B, a package substrate 100 may be provided. The package substrate 100 may include first and second substrate pads 102a and 102b provided on a top surface of the package substrate 100.

A first semiconductor chip 200 may be attached to the package substrate 100. The first semiconductor chip 200 may be attached in a face-up state to the package substrate 100. The first semiconductor chip 200 may have a top surface 200u or an active surface. A first adhesive layer 210 may be used to attach the first semiconductor chip 200 to the package substrate 100. For example, the first adhesive layer 210 may be provided on a bottom surface of the first semiconductor chip 200, and may adhere the first semiconductor chip 200 to the top surface of the package substrate 100.

The first semiconductor chip 200 may be wire-bonded to the package substrate 100. The first semiconductor chip 200 may be connected through first bonding wires 230 to the package substrate 100. For example, the first bonding wires 230 may connect first chip pads 220 of the first semiconductor chip 200 to the first substrate pads 102a of the package substrate 100.

Referring to FIGS. 22A and 22B, a second semiconductor chip 300 may be attached to the first semiconductor chip 200. The second semiconductor chip 300 may be attached in a face-up state to the first semiconductor chip 200. The second semiconductor chip 300 may have a top surface 300u or an active surface. A second adhesive layer 310 may be used to attach the second semiconductor chip 300 to the first semiconductor chip 200. For example, the second adhesive layer 310 may be provided on a bottom surface of the second semiconductor chip 300, and may adhere the second semiconductor chip 300 to a top surface of the first semiconductor chip 200. The second semiconductor chip 300 may be shifted from the first semiconductor chip 200 in a direction opposite to the first direction D1. For example, a connection region CR of the second semiconductor chip 300 may not overlap the first semiconductor chip 200, and an empty space may be provided between the package substrate 100 and the connection region CR of the second semiconductor chip 300. For example, no component may be provided to support the connection region CR of the second semiconductor chip 300.

Second chip pads 320 may include first unit pads 322 arranged along a first line L1 on a first region R1 and second unit pads 324 arranged along second lines L2 on the first region RE The first unit pads 322 may be disposed adjacent to a third lateral surface 300a. The first unit pads 322 may be arranged in the second direction D2 so as to be parallel to the third lateral surface 300a. The closer to fifth lateral surfaces 300c the second unit pads 324 are disposed, the farther away from the third lateral surface 300a the second unit pads 324 are disposed. The second chip pads 320 may not be provided on a second region R2.

Referring to FIGS. 23A, 23B, and 23C, the second semiconductor chip 300 may be wire-bonded to the package substrate 100. The second semiconductor chip 300 may be connected through second bonding wires 330 to the package substrate 100. FIGS. 23A, 23B, and 23C explain that the second unit pads 324 of the second chip pads 320 of the second semiconductor chip 300 are connected to the package substrate 100 in a wire bonding process of the second semiconductor chip 300.

A bonding machine MA may descend to come into contact with a top surface of one of the second unit pads 324. The bonding machine MA may spray a solder material to form a solder part BM on the top surface of the second unit pad 324.

Afterwards, the bonding machine MA may move onto one of the second substrate pads 102b of the package substrate 100, while spraying the solder material. In this step, the solder material sprayed from the bonding machine MA may form a second sub-wire 334 that connects one of the second unit pads 324 to one of the second substrate pads 102b.

Figure 24A:
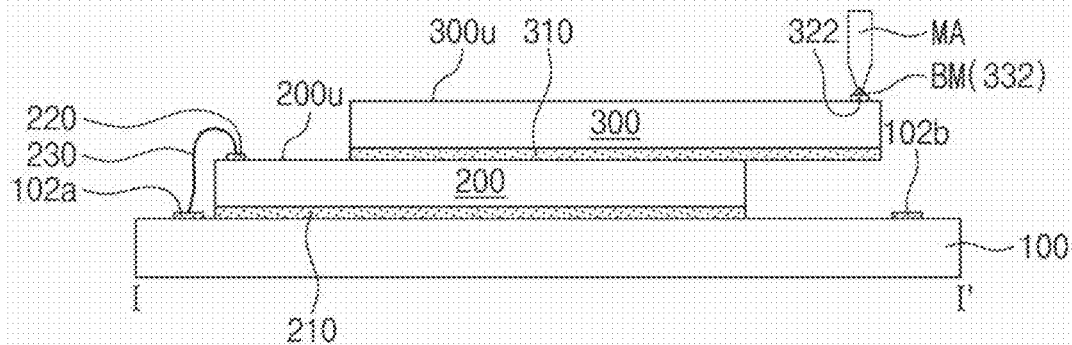
Figure 24B:
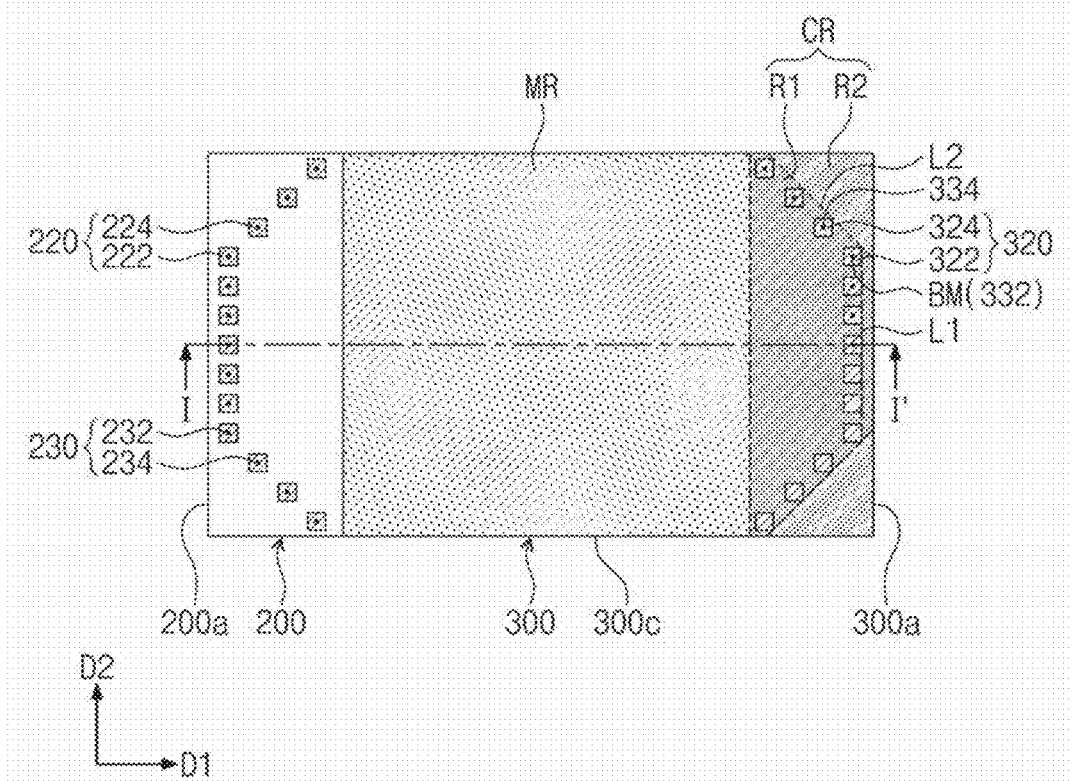

Referring to FIGS. 24A and 24B, the second semiconductor chip 300 may be wire-bonded to the package substrate 100. FIGS. 24A and 24B explain that the first unit pads 322 of the second chip pads 320 of the second semiconductor chip 300 are connected to the package substrate 100 in a wire bonding process of the second semiconductor chip 300.

The bonding machine MA may descend to come into contact with a top surface of one of the first unit pads 322. The bonding machine MA may spray a solder material to form a solder part BM on the top surface of the first unit pad 322. In this step, a pressure applied by the bonding machine MA to the first unit pad 322 may be the same as a pressure applied by the bonding machine MA to the second unit pads 324 in a wire bonding process performed on the second unit pads 324. The present inventive concepts, however, are not limited thereto.

After that, the bonding machine MA may move onto one of the second substrate pads 102b of the package substrate 100 while spraying the solder material. In this step, the solder material sprayed from the bonding machine MA may form a first sub-wire 332 that connects one of the first unit pads 322 to one of the second substrate pads 102b.

Figure 25A:
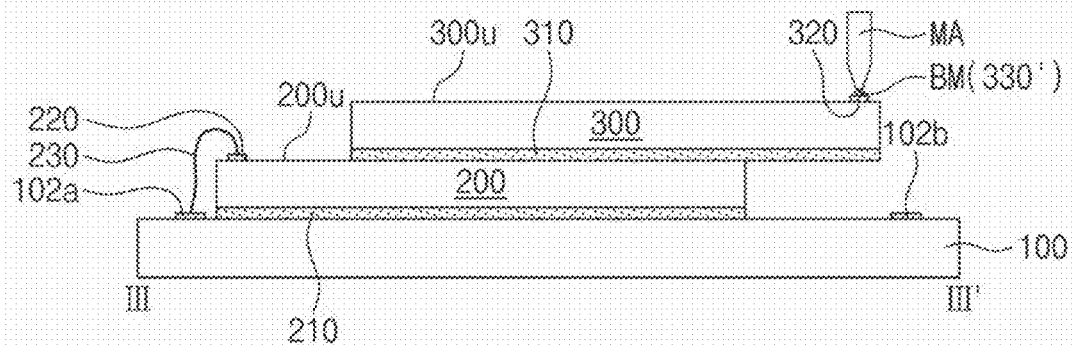
Figure 25B:
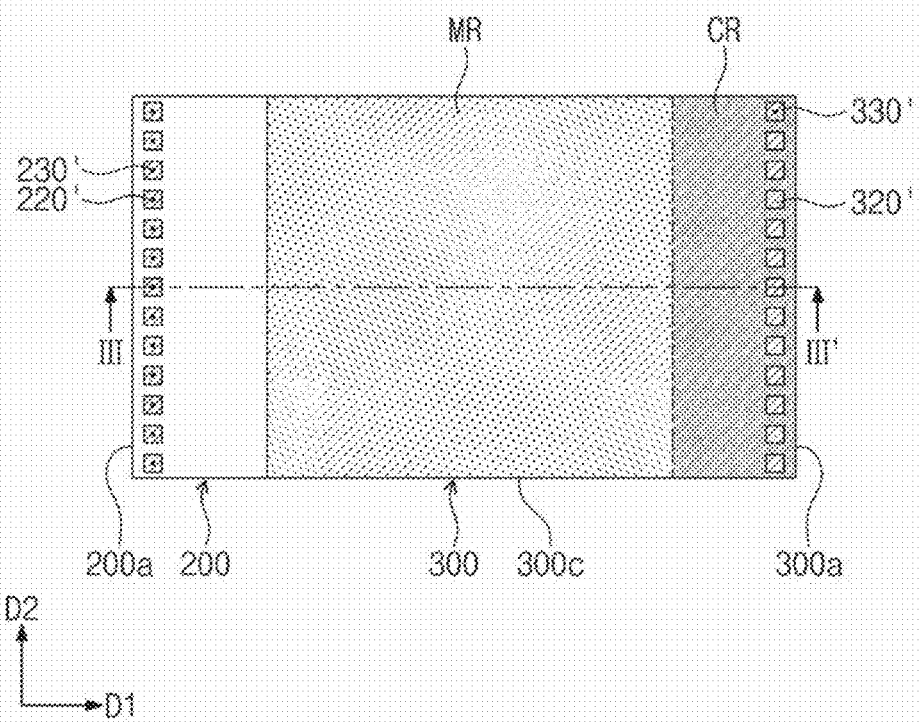

In general, during a bonding process for wire bonding, a bonding machine may bring into contact with pads, and in this case, may provide the pads with vertical pressure. When a certain pressure is applied to one point on a semiconductor chip, the largest torque may be exerted on a corner of the semiconductor chip, and the corner of the semiconductor chip may be most vulnerable to fracture. For example, as shown in FIGS. 25A and 25B, when pads 320' of the second semiconductor chip 300 are disposed adjacent to a corner of the second semiconductor chip 300, the bonding machine MA may compress the pad 320' adjacent to the corner of the second semiconductor chip 300, and in this case, the bonding machine MA may cause fracture of the second semiconductor chip 300.

According to some example embodiments of the present inventive concepts, the connection region CR of the second semiconductor chip 300 may not be supported by the first semiconductor chip 200, and an empty space may be provided between the package substrate 100 and the connection region CR of the second semiconductor chip 300. No pad may be provided on the second region R2 in the vicinity of a corner of the second semiconductor chip 300, and therefore, a pressure exerted by the bonding machine MA may not be applied to the second region R2 of the second semiconductor chip 300. Accordingly, it may be possible to cause less fracture of semiconductor chips in semiconductor fabrication process and to provide a semiconductor fabrication method with less occurrence of failure. In addition, because no pads are provided on the second region R2 of the second semiconductor chip 300, it may be possible to allow the bonding machine MA to rapidly form bonding parts on pads at high pressure and to provide a semiconductor fabrication method with high speed.

In a semiconductor package according to some example embodiments of the present inventive concepts, small pressure and torque may be applied to semiconductor chips in a wire bonding process of semiconductor package fabrication. In particular, it may be possible to reduce pressure and torque applied to semiconductor chips disposed at high levels while stacking the same semiconductor chips, and to decrease pressure and torque exerted on semiconductor chips having large protruding lengths from an adjacent other semiconductor chip. It may thus be possible to provide a semiconductor fabrication method with less occurrence of failure and to provide a semiconductor package with increased structural stability.

It will be understood that elements and/or properties thereof described herein that are described with a numerical value include a tolerance of ±10% around the stated numerical value.

Moreover, it may be possible to allow a bonding machine to rapidly form bonding parts on pads at high pressure and to provide a semiconductor fabrication method with high speed.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:
1. A semiconductor package, comprising:
a substrate;
a plurality of semiconductor chips stacked on the substrate and each of the plurality of semiconductor chips including a plurality of first pads and a plurality of second pads on a top surface thereof; and
a plurality of bonding wires that connect the plurality of first pads and the plurality of second pads of the plurality of semiconductor chips to the substrate,
wherein the plurality of semiconductor chips each protrude relative to adjacent ones of the plurality of semiconductor chips alternately in a first direction and a direction opposite to the first direction, and protruding distances of the plurality of semiconductor chips being same as each other,
wherein the plurality of semiconductor chips each have a first lateral surface spaced apart from another of the plurality of semiconductor chips in overlying or underlying contact therewith,
wherein the top surface of each of the plurality of semiconductor chips is provided thereon with,
a first arrangement line that extends along the first lateral surface; and
a plurality of second arrangement lines that extend from opposite ends of the first arrangement line, wherein as the second arrangement lines increase in distance from the first arrangement line, the second arrangement lines increase in distance from the first lateral surface,
wherein the plurality of first pads are arranged along the first arrangement line, and
wherein the plurality of second pads are arranged along the second arrangement lines.

2. The semiconductor package of claim 1, wherein
the first arrangement line is a straight line parallel to the first lateral surface, and
the second arrangement lines are straight lines that are inclined at 45 degrees relative to the first lateral surface.

3. The semiconductor package of claim 1, wherein an increase in distance between the substrate and the plurality of semiconductor chips includes a reduction in length of the first arrangement line and an increase in length of each of the second arrangement lines.

4. The semiconductor package of claim 1, wherein
the top surface of each of the semiconductor chips has a plurality of chamfer regions defined by the second arrangement lines, the first lateral surface, and a plurality of second lateral surfaces in contact with the first lateral surface, and
no pad is provided on the chamfer regions.

5. The semiconductor package of claim 1, wherein each of the plurality of second pads of each of the plurality of semiconductor chips has a linear shape that extends toward the first lateral surface.

6. The semiconductor package of claim 5, wherein as a distance between the substrate and the plurality of semiconductor chips increases, a distance between the first lateral surface and bonding positions of the bonding wires to the plurality of second pads increases.

7. The semiconductor package of claim 1, wherein
each of the plurality of semiconductor chips further includes a plurality of dummy pads arranged in a second direction toward the first lateral surface and away from the plurality of second pads, and
a single pad group is constituted by one of the plurality of second pads and at least one of the plurality of dummy pads, the at least one dummy pad being positioned in the second direction of the one second pad.

8. The semiconductor package of claim 7, wherein
the bonding wire is bonded to one selected from the plurality of dummy pads and the one second pad of the pad group, and
wherein as a distance between the substrate and the plurality of semiconductor chips increases, a distance between the first lateral surface and a bonding position of the bonding wire to the one dummy pad and the one second pad of the pad group increases.

9. The semiconductor package of claim 1, wherein
the plurality of semiconductor chips include a plurality of first semiconductor chips and a plurality of second semiconductor chips that are alternately stacked with each other on the substrate,
wherein the first lateral surfaces of the plurality of first semiconductor chips are on a same first plane, and
the first lateral surfaces of the plurality of second semiconductor chips are on a same second plane.

10. The semiconductor package of claim 9, wherein
the plurality of semiconductor chips are the same, and
planar shapes of the plurality of first semiconductor chips are symmetric in the first direction to planar shapes of the plurality of second semiconductor chips.

* * * * *